US011501833B2

(12) United States Patent
Maejima

(10) Patent No.: US 11,501,833 B2
(45) Date of Patent: Nov. 15, 2022

(54) SEMICONDUCTOR STORAGE DEVICE AND CONTROLLER

(71) Applicant: KIOXIA CORPORATION, Tokyo (JP)

(72) Inventor: Hiroshi Maejima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 452 days.

(21) Appl. No.: 16/788,639

(22) Filed: Feb. 12, 2020

(65) Prior Publication Data

US 2020/0183593 A1 Jun. 11, 2020

Related U.S. Application Data

(63) Continuation of application No. 16/158,240, filed on Oct. 11, 2018, now Pat. No. 10,564,860, which is a
(Continued)

(30) Foreign Application Priority Data

Jun. 6, 2012 (JP) .............................. JP2012-128727

(51) Int. Cl.
*G11C 16/04* (2006.01)
*G11C 16/10* (2006.01)
(Continued)

(52) U.S. Cl.
CPC ............ *G11C 16/10* (2013.01); *G06F 3/0614* (2013.01); *G06F 3/0631* (2013.01);
(Continued)

(58) Field of Classification Search
CPC ........ G11C 16/10; G11C 8/08; G11C 16/0483
See application file for complete search history.

(56) References Cited

U.S. PATENT DOCUMENTS 6,314,026 B1 11/2001 Satoh et al.
7,024,524 B2 4/2006 Nii
(Continued)

FOREIGN PATENT DOCUMENTS

JP 2006048930 A 2/2006
JP 2011187152 A 9/2011
(Continued)

OTHER PUBLICATIONS

Taiwan Office Action dated May 8, 2017, filed in Taiwan counterpart Application No. 104144345, 10 pages (with translation).
(Continued)

*Primary Examiner* — Uyen Smet
(74) *Attorney, Agent, or Firm* — Kim & Stewart LLP

(57) ABSTRACT

A semiconductor storage device includes memory cells, select transistors, memory strings, first and second blocks, word lines, and select gate lines. In the memory string, the current paths of plural memory cells are connected in series. When data are written in a first block, after a select gate line connected to the gate of a select transistor of one of the memory strings in the first block is selected, the data are sequentially written in the memory cells in the memory string connected to the selected select gate line. When data are written in the second block, after a word line connected to the control gates of memory cells of different memory strings in the second block is selected, the data are sequentially written in the memory cells of the different memory strings in the second block which have their control gates connected to the selected word line.

20 Claims, 31 Drawing Sheets

Related U.S. Application Data continuation of application No. 15/723,295, filed on Oct. 3, 2017, now Pat. No. 10,126,957, which is a continuation of application No. 15/337,852, filed on Oct. 28, 2016, now Pat. No. 9,811,270, which is a continuation of application No. 14/833,719, filed on Aug. 24, 2015, now Pat. No. 9,514,825, which is a continuation of application No. 13/779,427, filed on Feb. 27, 2013, now Pat. No. 9,153,325.

(51) Int. Cl.

| | |
|---|---|
| G11C 16/16 | (2006.01) |
| G06F 12/02 | (2006.01) |
| G11C 16/34 | (2006.01) |
| G11C 11/56 | (2006.01) |
| G06F 3/06 | (2006.01) |

(52) U.S. Cl.
CPC .......... *G06F 3/0652* (2013.01); *G06F 3/0659* (2013.01); *G06F 3/0665* (2013.01); *G06F 3/0679* (2013.01); *G06F 12/0246* (2013.01); *G11C 11/5635* (2013.01); *G11C 16/0483* (2013.01); *G11C 16/16* (2013.01); *G11C 16/3418* (2013.01); *G06F 2212/1032* (2013.01); *G06F 2212/152* (2013.01); *G06F 2212/214* (2013.01); *G06F 2212/7202* (2013.01); *G11C 2213/71* (2013.01)

(56) References Cited

U.S. PATENT DOCUMENTS

| | | | |
|---|---|---|---|
| 7,719,902 | B2 | 5/2010 | Dong et al. |
| 8,203,883 | B2 | 6/2012 | Fujimura |
| 8,570,805 | B2 | 10/2013 | Lee et al. |
| 2003/0048661 | A1 | 3/2003 | Sakui et al. |
| 2005/0024939 | A1 | 2/2005 | Chen et al. |
| 2006/0140011 | A1 | 6/2006 | Fong et al. |
| 2006/0197136 | A1 | 9/2006 | Futatsuyama et al. |
| 2006/0250849 | A1 | 11/2006 | Ichige et al. |
| 2007/0025161 | A1 | 2/2007 | Park et al. |
| 2007/0141780 | A1 | 6/2007 | Higashitani |
| 2007/0297232 | A1 | 12/2007 | Iwata |
| 2008/0019187 | A1 | 1/2008 | Kux et al. |
| 2008/0043528 | A1 | 2/2008 | Isobe et al. |
| 2008/0052447 | A1 | 2/2008 | Sukegawa et al. |
| 2008/0158968 | A1 | 7/2008 | Moogat et al. |
| 2008/0266949 | A1 | 10/2008 | He et al. |
| 2008/0279012 | A1 | 11/2008 | Lee |
| 2008/0291747 | A1 | 11/2008 | Goodwin et al. |
| 2009/0021982 | A1 | 1/2009 | Matsunaga et al. |
| 2009/0251971 | A1 | 10/2009 | Futatsuyama |
| 2009/0268524 | A1 | 10/2009 | Maejima |
| 2009/0273976 | A1 | 11/2009 | Maejima et al. |
| 2009/0287879 | A1 | 11/2009 | Oh et al. |
| 2009/0316490 | A1 | 12/2009 | Takada |
| 2010/0034028 | A1 | 2/2010 | Katsumata et al. |
| 2010/0054036 | A1 | 3/2010 | Lee et al. |
| 2010/0097858 | A1 | 4/2010 | Tokiwa et al. |
| 2010/0159657 | A1 | 6/2010 | Arai et al. |
| 2010/0172189 | A1 | 7/2010 | Itagaki et al. |
| 2010/0195383 | A1 | 8/2010 | Prashant et al. |
| 2010/0277977 | A1 | 11/2010 | Nakamura |
| 2010/0322000 | A1 | 12/2010 | Shim et al. |
| 2011/0013454 | A1 | 1/2011 | Hishida et al. |
| 2011/0069552 | A1 | 3/2011 | Itagaki et al. |
| 2011/0069557 | A1 | 3/2011 | Namiki et al. |
| 2011/0103149 | A1 | 5/2011 | Katsumata et al. |
| 2011/0108901 | A1 | 5/2011 | Matsunami et al. |
| 2011/0157989 | A1* | 6/2011 | Iwata .............. G11C 16/0483 365/185.17 |
| 2011/0199825 | A1 | 8/2011 | Han et al. |
| 2011/0216603 | A1 | 9/2011 | Han et al. |
| 2012/0005416 | A1 | 1/2012 | Lee et al. |
| 2012/0057405 | A1 | 3/2012 | Ryu et al. |
| 2012/0069681 | A1 | 3/2012 | Oikawa |
| 2012/0119283 | A1 | 5/2012 | Lee et al. |
| 2012/0151124 | A1 | 6/2012 | Baek et al. |
| 2013/0033928 | A1 | 2/2013 | Kawahara et al. |

FOREIGN PATENT DOCUMENTS

| | | |
|---|---|---|
| TW | 201011757 A | 3/2010 |
| TW | 201106359 A | 2/2011 |

OTHER PUBLICATIONS

Taiwan Office Action dated Dec. 16, 2016, filed in Taiwan counterpart Application No. 104144345, 5 pages (with translation).

Taiwan Office Action dated Mar. 23, 2015, filed in Taiwan counterpart Application No. 102106464, 5 pages (with translation).

Taiwan Office Action dated Apr. 10, 2018, filed in Taiwan counterpart Application No. 106132429, 18 pages (with translation).

* cited by examiner

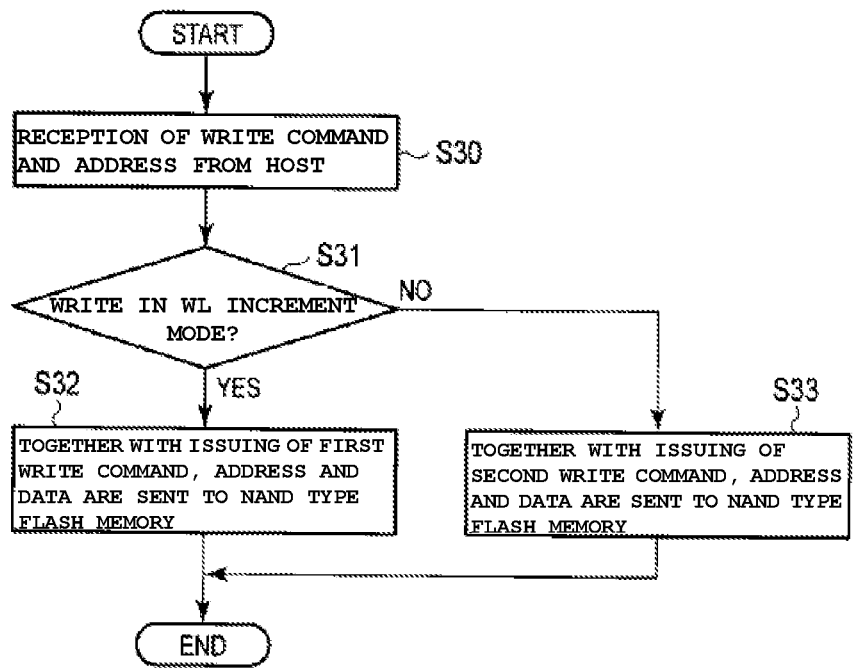

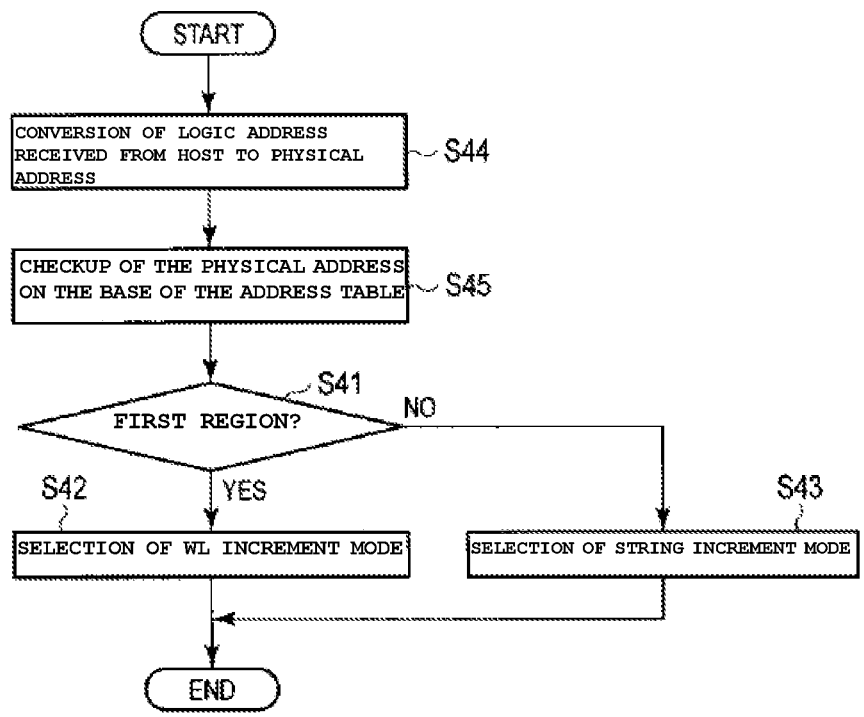

| BLOCK ADDRESS | WRITE METHOD | ERASING METHOD |
|---|---|---|
| FIRST REGION (BLK0~BLK511) | WL INCREMENT | BLOCK ERASING OR SUB-BLOCK ERASING |
| SECOND REGION (BLK512~BLK2042) | STRING INCREMENT | BLOCK ERASING |

Fig. 39

| | WRITE METHOD | ERASING METHOD | SLC/MLC | SELF BOOST SYSTEM |
|---|---|---|---|---|
| FIRST REGION | WL INCREMENT | BLOCK ERASING OR SUB-BLOCK ERASING | SLC SYSTEM | CONVENTIONAL SYSTEM (AND LASB) |
| FIRST REGION | STRING INCREMENT | BLOCK ERASING | MLC SYSTEM | EASB (AND LASB) |

SEMICONDUCTOR STORAGE DEVICE AND CONTROLLER

CROSS-REFERENCE TO RELATED APPLICATIONS

This application is a continuation of U.S. patent application Ser. No. 16/158,240, filed on Oct. 11, 2018, which is a continuation of U.S. patent application Ser. No. 15/723,295, filed on Oct. 3, 2017, now U.S. Pat. No. 10,126,957, granted on Nov. 13, 2018, which is a continuation of U.S. patent application Ser. No. 15/337,852, filed on Oct. 28, 2016, now U.S. Pat. No. 9,811,270, granted on Nov. 7, 2017, which is a continuation of U.S. patent application Ser. No. 14/833,719, filed on Aug. 24, 2015, now U.S. Pat. No. 9,514,825, granted on Dec. 6, 2016, which is a continuation of U.S. patent application Ser. No. 13/779,427, filed on Feb. 27, 2013, now U.S. Pat. No. 9,153,325, granted on Oct. 6, 2015, which is based upon and claims the benefit of priority from Japanese Patent Application No. 2012-128727, filed Jun. 6, 2012; the entire contents of each of these applications are incorporated herein by reference.

FIELD

Embodiments described herein relate generally to a semiconductor storage device and a controller.

BACKGROUND

A NAND type flash memory with memory cells arranged three-dimensionally has been developed and it is desirable to provide such a device and a controller for the device with improved operation reliability.

DESCRIPTION OF THE DRAWINGS

FIG. 20 is a flow chart illustrating a write operation of the third embodiment.

FIG. 21 is a schematic diagram illustrating a selection table of the third embodiment.

FIG. 24 is a flow chart illustrating the write operation of the third embodiment.

FIG. 25 is a schematic diagram illustrating the selection table of the third embodiment.

FIG. 39 is a diagram illustrating the operation of a modified example of a memory system of the first through fifth embodiments.

DETAILED DESCRIPTION

In general, the storage device according to an embodiment of the present invention includes: a first memory string including a first select transistor, a first memory cell, and a second memory cell; a second memory string including a second select transistor, a third memory cell, and a fourth memory cell; a bit line electrically connected to the first memory string and the second memory string; a first select gate line electrically connected to a gate of the first select transistor; a second select gate line electrically connected to a gate of the second select transistor; a first word line electrically connected to a gate of the first memory cell and a gate of the third memory cell; a second word line electrically connected to a gate of the second memory cell and a gate of the fourth memory cell; and a control circuit. The control circuit is configured to perform a first operation, the first operation including supplying a first program voltage to the first word line, and supplying a first select voltage to the first select gate line, perform a second operation after the first operation, the second operation including supplying a second program voltage to the first word line, and supplying a second select voltage to the second select gate line, perform a third operation after the second operation, the third operation including supplying a third program voltage to the second word line, and supplying a third select voltage to the first select gate line, and perform a fourth operation after the third operation, the fourth operation including supplying a fourth program voltage to the second word line, and supplying a fourth select voltage to the second select gate line.

Embodiments of the present invention will be explained with reference to figures. The same keys will be adopted throughout the figures in this explanation.

1. Embodiment 1

In the following, the semiconductor storage device related to Embodiment 1 will be explained. The semiconductor storage device will be explained with reference to an example of a three-dimensional, laminated, NAND type flash memory with memory cells laminated on a semiconductor substrate.

1.1 Regarding the Constitution of the Semiconductor Storage Device

First, the constitution of the semiconductor storage device related to this embodiment will be explained.

1.1.1 Regarding the Overall Constitution of the Semiconductor Storage Device

Figure 1:
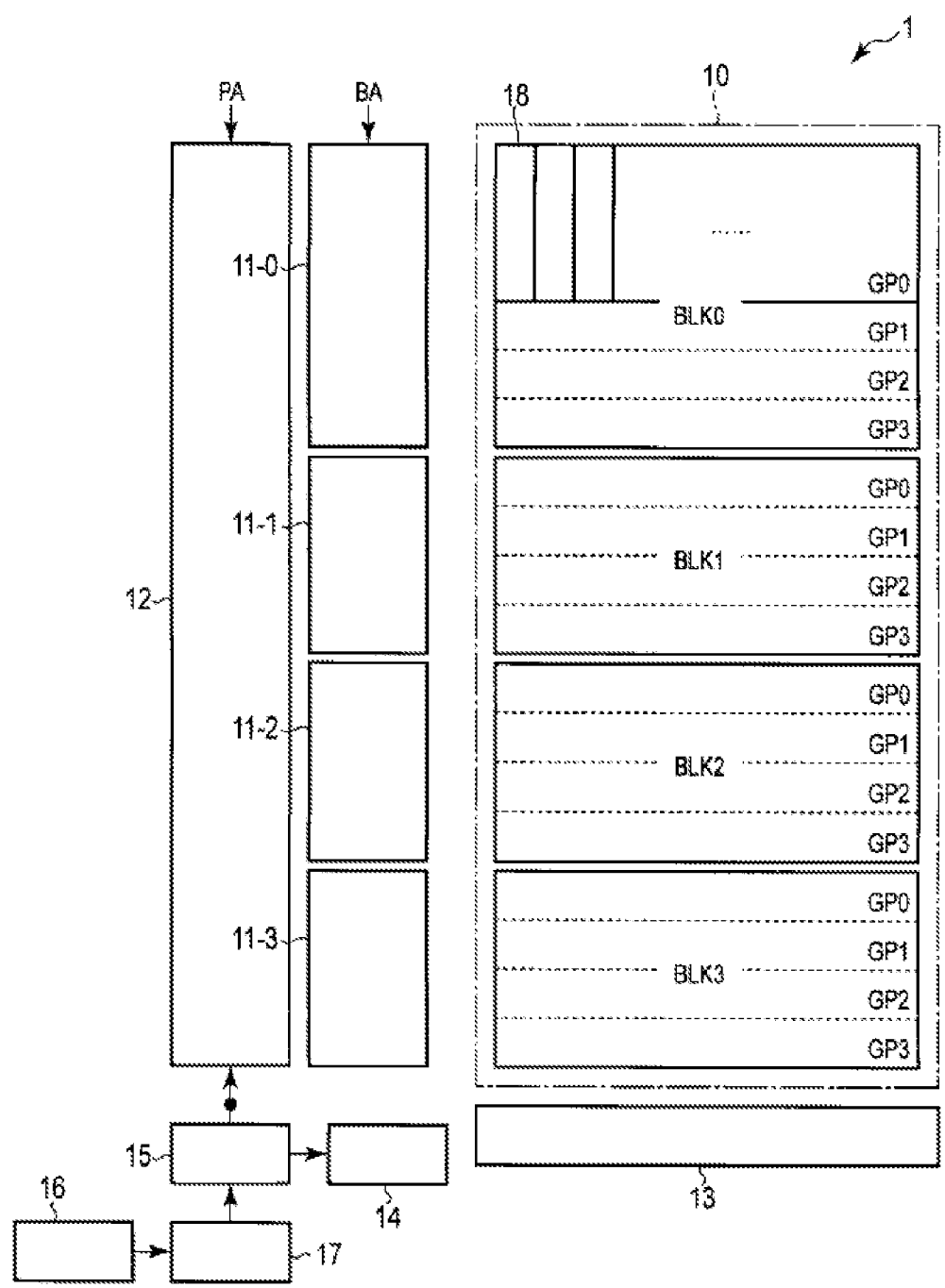
FIG. 1 is a block diagram illustrating a semiconductor storage device according to a first embodiment.

FIG. 1 is a block diagram illustrating the semiconductor storage device related to this embodiment. As shown in the figure, the NAND type flash memory 1 has a memory cell array 10, row decoders 11 (11-0 to 11-3), a driver circuit 12, a sense amplifier 13, a bit line/source line driver (BL/SL driver) 14, a voltage generator 15, a command register 16, and a control part 17.

The memory cell array 10 has a plurality (4 in this example) of blocks BLK (BLK0 to BLK3), each of which is a collection of nonvolatile memory cells. The data in the same blocks BLK can be erased en bloc. Each of the blocks BLK has a plurality (4 in this example) of memory groups GP (GP0 to GP3), each of which is a collection of NAND strings 18 that have memory cells connected in series. Of course, there is no restriction on the number of blocks in the memory cell array 10 and the number of the memory groups in each of blocks BLK.

The row decoders 11-0 to 11-3 are arranged corresponding to the blocks BLK0 to BLK3, respectively. The row direction of the corresponding block BLK is selected.

The driver circuit 12 feeds the voltage needed for data read and write as well as erasing to the row decoders 11. This voltage is applied to the memory cells by the row decoders 11.

The sense amplifier 13 senses and amplifies the data read from the memory cells in the data read operation. Also, the write data are transferred to the memory cells in the data write operation.

The BL/SL driver 14 applies the voltage needed for data write, read and erasing on bit lines and source lines and is explained later.

The voltage generator 15 generates the voltage needed for data write, read and erasing, and feeds the voltage to the driver circuit 12 and the BL/SL driver 14.

The command register 16 holds a command input from the outside.

The control part 17 controls the overall operation of the NAND type flash memory 1 on the basis of the command kept in the command register 16.

1.1.2 About the Memory Cell Array 10

Figure 2:
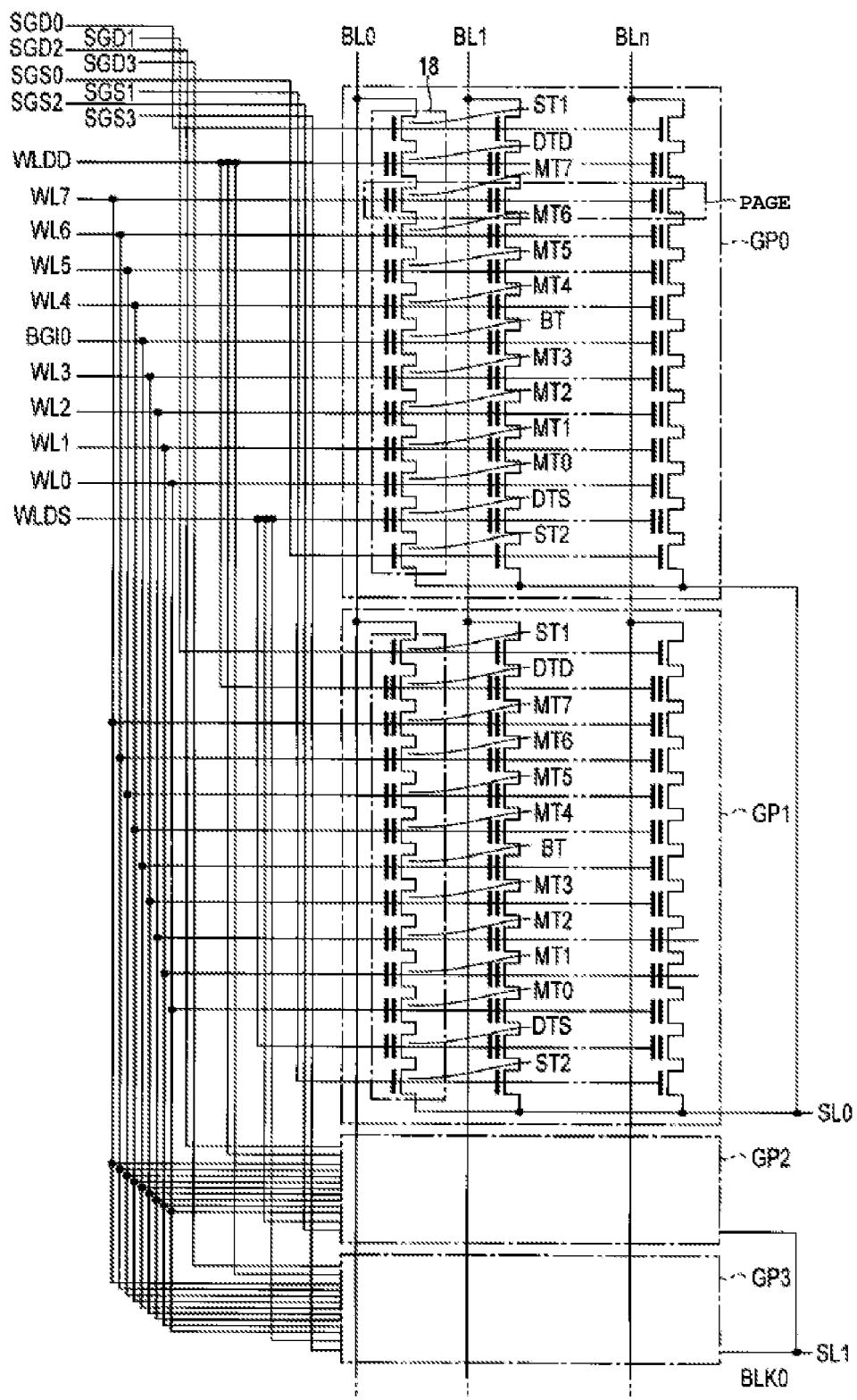
FIG. 2 is a circuit diagram illustrating a memory cell array of the first embodiment.

In the following, the constitution of the memory cell array 10 is explained in more detail. FIG. 2 is a circuit diagram illustrating the block BLK0. The blocks BLK1 to BLK3 have the same constitution as block BLK0.

As shown in the figure, the block BLK0 contains four memory groups GP. Each of the memory groups GP contains n (n is a natural number) NAND strings 18.

Each of the NAND strings 18 contains, e.g., 8 memory cell transistors MT (MT0 to MT7), select transistors ST1, ST2, and a back gate transistor BT. Each of the memory cell transistors MT has a laminated gate containing a control gate and a charge storage layer, and it holds the data in nonvolatile state. The number of the memory cell transistors MT is not limited to 8. It may be 16, 32, 64, 128, etc. There is no specific restriction on this number. As with the memory cell transistors MT, the back gate transistor BT also has a laminated gate containing a control gate and a charge storage layer. However, the back gate transistor BT does not hold data. It works only as a current path for data write and read operations. The memory cell MT and the back gate transistor BT are arranged between the select transistors ST1, ST2, with its current path connected in series. In addition, the back gate transistor BT is arranged between the memory cell transistors MT3 and MT4. The current path of the memory cell transistor MT7 at one end side of the serial connection is connected to an end of the current path of the select transistor ST1; the current path of the memory cell transistor MT0 on the other end side is connected to an end of the current path of the select transistor ST2.

In the constitution of the present embodiment, in each of the NAND strings 18, a dummy transistor DTD is arranged with its current path connected in series between the select transistor ST1 and the memory cell transistor MT7. A dummy transistor DTS is also arranged with its current path connected in series between the select transistor ST2 and the memory cell transistor MT0. The dummy transistors DTD, DTS have the same constitution as that of the memory cell transistors MT. However, they are not for data storage, and they remain on in the data write and read operation.

The gates of the select transistors ST1 of the memory groups GP0 to GP3 are commonly connected to select gate lines SGD0 to SGD3, respectively. The gates of the select transistors ST2 are commonly connected to the select gate lines SGS0 to SGS3, respectively. On the other hand with respect to the configuration, the control gates of the memory cell transistors MT0 to MT7 in the same block BLK0 are commonly connected to word lines WL0 to WL7. The control gates of the back gate transistors BT are commonly connected to back gate lines BG (BG0 to BG3 in blocks BLK0 to BLK3, respectively). The control gates of the dummy transistors DTD, DTS are commonly connected to dummy word lines WLDD, WLDS, respectively.

That is, the word lines WL0 to WL7, back gate line BG, and dummy word lines WLDD, WLDS are commonly connected between the plural memory groups GP0 to GP3 in the same block BLK0. On the other hand, with respect to the configuration, the select gate lines SGD, SGS are set independent in each of the memory groups GP0 to GP3 in the same block BLK0.

Also, among the NAND strings 18 arranged in matrix configuration in the memory cell array 10, the other ends of the current paths of the select transistors ST1 of the NAND strings 18 in the same row are commonly connected to certain bit lines BL (BL0 to BLn, where n represents a natural number). That is, the bit line BL is commonly connected to the NAND strings 18 between plural blocks BLK. The other end of the current path of the select transistor ST2 is connected to the source lines SL (SL0, SL1). In this embodiment, the select transistors ST2 of the memory groups GP0, GP1 are commonly connected to the source line SL0, and the select transistor ST2 of the memory groups GP2, GP3 are commonly connected to the source line SL1. The source line SL0 and the source line SL1 are electrically separated from each other, and they are independently controlled by the BL/SL driver 14. The source lines SL0, SL1 are also commonly connected between different blocks, respectively.

As explained above, the data of the memory cell transistors MT in the same block BLK can be erased en bloc. On the other hand, data read and write operations are carried out en bloc for the plural memory cell transistors MT. Commonly, they are connected to a certain word line WL in a certain memory group GP of a certain block BLK. This unit is called a "page".

Figure 3:
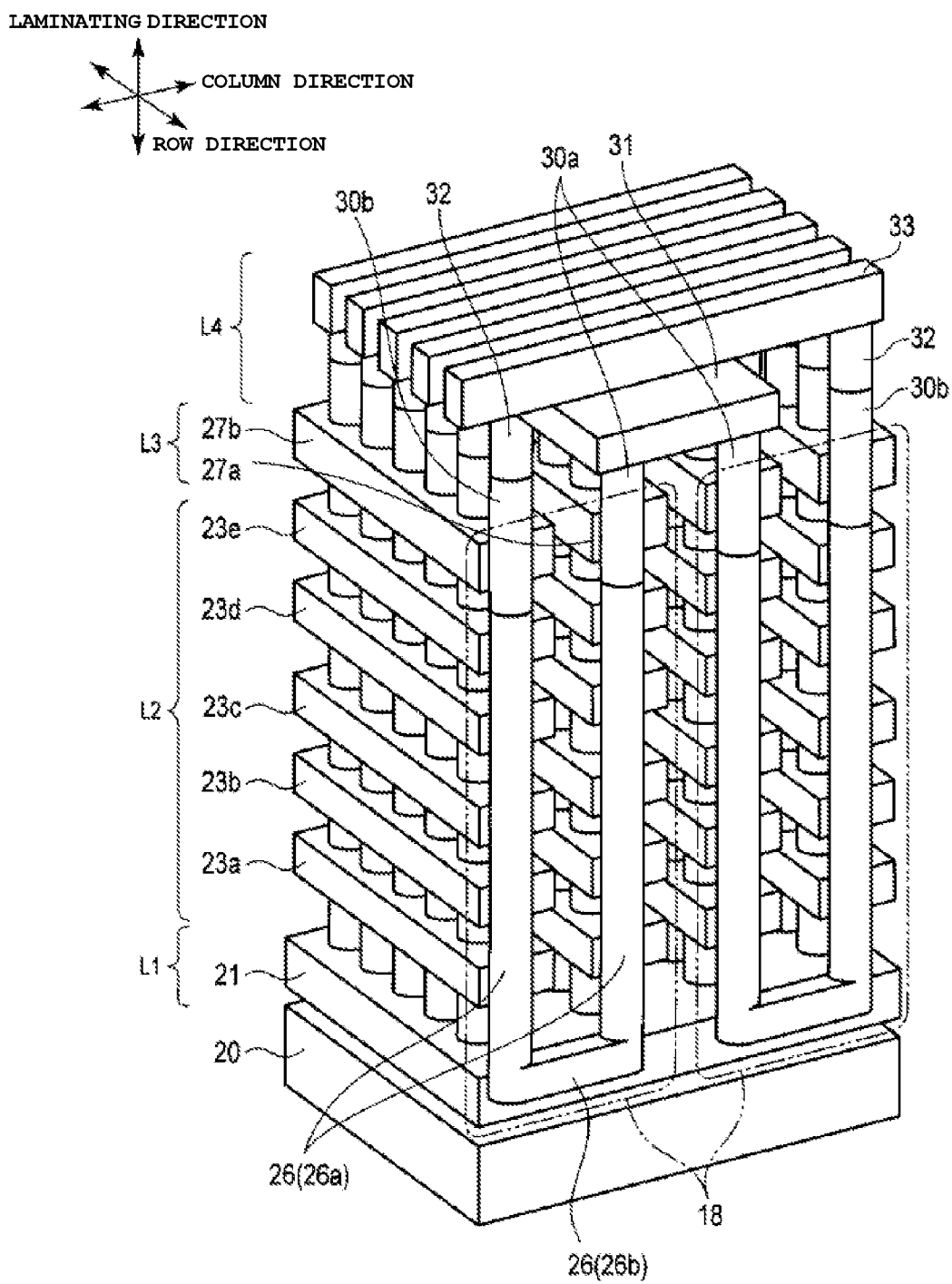
FIG. 3 is a perspective view illustrating the memory cell array of the first embodiment.
Figure 4:
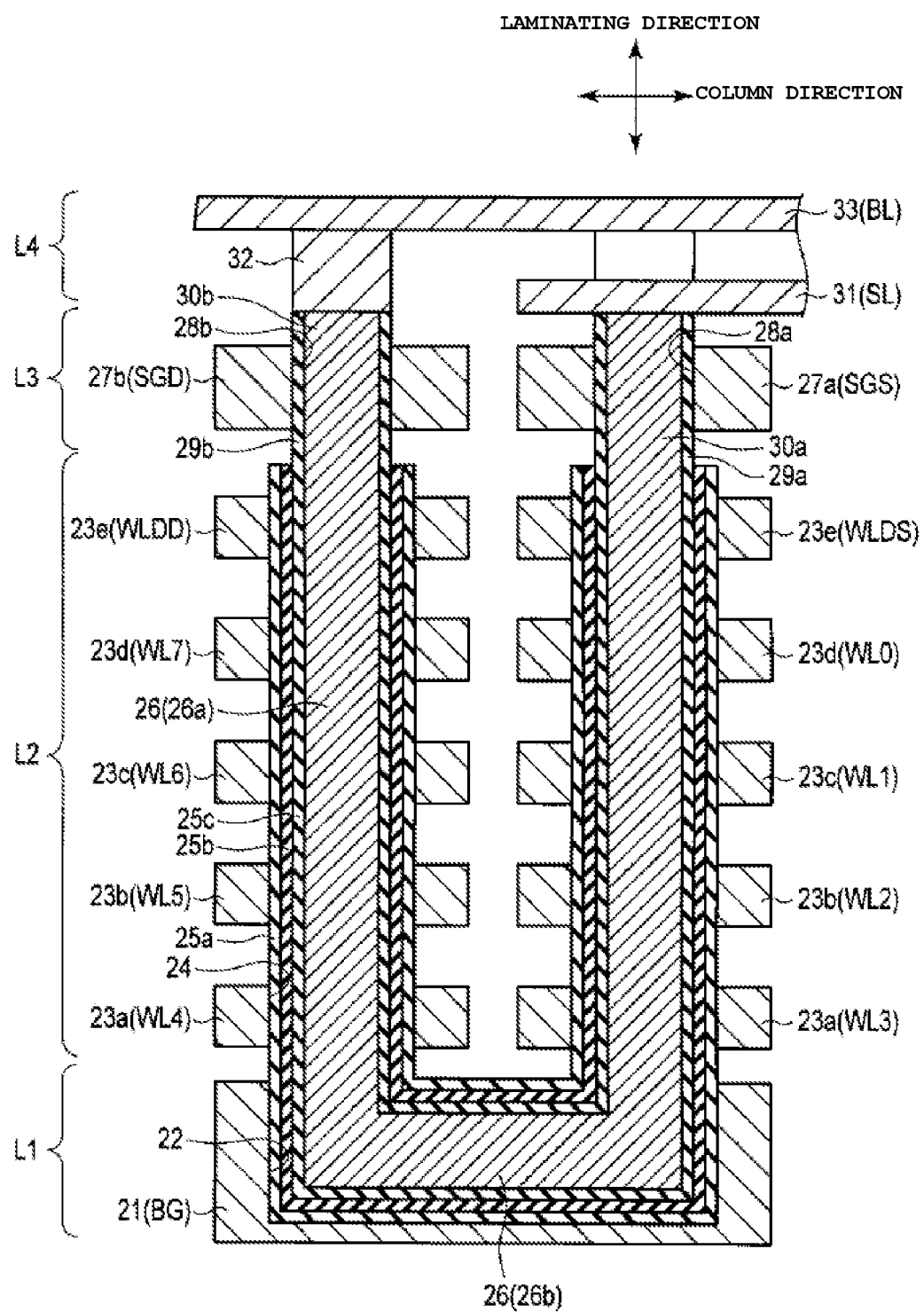
FIG. 4 is a cross-sectional view illustrating the memory cell array of the first embodiment.

In the following, the three-dimensional laminating structure of the memory cell array 10 will be explained with reference to FIGS. 3 and 4. Here, FIGS. 3 and 4 are perspective and cross-sectional views illustrating the memory cell array 10, respectively.

As shown in the figure, the memory cell array 10 is arranged on the semiconductor substrate 20. The memory cell array 10 has back gate transistor layer L1, a memory cell transistor layer L2, a select transistor layer L3, and a wiring layer L4 formed sequentially on the semiconductor substrate 20.

The back gate transistor layer L1 works as back gate transistor BT. The memory cell transistor layer L2 works as the memory cell transistors MT0 to MT7 and the dummy transistors DTD, DTS. The select transistor layer L3 works as select transistors ST1, ST2. The wiring layer L4 works as the source lines SL and bit lines BL.

The back gate transistor layer L1 has a back gate electroconductive layer 21. The back gate electroconductive layer 21 is formed to spread two-dimensionally in the row and column directions parallel with the semiconductor substrate 20. The back gate electroconductive layer 21 is divided for each block BLK. The back gate electroconductive layer 21 may be made of, for example, polysilicon. The back gate electroconductive layer 21 works as the back gate line BG.

As shown in FIG. 4, the back gate electroconductive layer 21 contains back gate holes 22. The back gate holes 22 are formed by digging the back gate electroconductive layer 21. The back gate holes 22 are formed substantially in a rectangular shape with the column direction as a longitudinal direction when viewed from the upper surface.

The memory cell transistor layer L2 is formed in the upper layer of the back gate transistor layer L1. The memory cell transistor layer L2 has word line electroconductive layers 23a to 23d and a dummy word line layer 23e. The word line electroconductive layers 23a to 23e are laminated with an interlayer insulating layer (not shown in the figure) sandwiched between them. The word line electroconductive layers 23a to 23e are formed in a stripe shape extending in the row direction with a prescribed pitch in the column direction. For example, the word line electroconductive layers 23a to 23e may be made of polysilicon. The electroconductive layer 23a works as the control gates (word lines WL3, WL4) for the memory cell transistors MT3, MT4; the electroconductive layer 23b works as the control gates (word lines WL2, WL5) for the memory cell transistors MT2, MT5, respectively. Electroconductive layer 23c works as the control gates (word lines WL1, WL6) for the memory cell transistors MT1, MT6, and the electroconductive layer 23d works as the control gates (word lines WL0, WL7) for the memory cell transistors MT0, MT7. Also, the dummy word line layer 23e works as the control gates (dummy word lines WLDD, WLDS) for the dummy transistors DTD, DTS.

As shown in FIG. 4, the memory cell transistor layer L2 has memory holes 24. The memory holes 24 are formed through the electroconductive layers 23a to 23e. The memory holes 24 are formed to be aligned near the end portion in the column direction of the back gate holes 22, respectively.

As shown in FIG. 4, the back gate transistor layer L1 and memory cell transistor layer L2 have a block insulating layer 25a, a charge accumulating layer 25b, a tunnel insulating layer 25c, and a semiconductor layer 26. Here, the semiconductor layer 26 works as a body (the back gate of each transistor) of the NAND strings 18.

Also shown in FIG. 4, a block insulating layer 25a is formed with a prescribed thickness on the side wall facing the back gate holes 22 and the memory holes 24. The charge accumulating layer 25b is formed with a prescribed thickness on the side surface of the block insulating layer 25a. A tunnel insulating layer 25c is formed with a prescribed thickness on the side surface of the charge accumulating layer 25b. A semiconductor layer 26 is formed to join the side surface of the tunnel insulating layer 25c. The semiconductor layer 26 is formed to fill the back gate holes 22 and the memory holes 24.

The semiconductor layer 26 is formed in a U-shape as viewed in the row direction. The semiconductor layer 26 has a pair of pillar portions 26a that extend in the vertical direction with respect to the surface of the semiconductor substrate 20, and a connecting portion 26b that connects the lower ends of the pair of pillar portions 26a.

For example, the block insulating layer 25a and the tunnel insulating layer 25c may be made of silicon dioxide ($SiO_2$). The charge accumulating layer 25b may be made of silicon nitride (SiN). The semiconductor layer 26 is made of polysilicon. The block insulating layer 25a, the charge accumulating layer 25b, the tunnel insulating layer 25c and the semiconductor layer 26 form MONOS type transistors that work as the memory cell transistors MT and the dummy transistors DTD, DTS.

As the constitution of the back gate transistor layer L1 is viewed from another viewing angle, the tunnel insulating layer 25c is formed to surround the connecting portion 26b. The back gate electroconductive layer 21 is formed to surround the connecting portion 26b.

As the constitution of the memory cell transistor layer L2 is viewed from another viewing angle, the tunnel insulating layer 25c is formed to surround the pillar portions 26a. The charge accumulating layer 25b is formed to surround the tunnel insulating layer 25c. The block insulating layer 25a is formed to surround the charge accumulating layer 25b. The word line electroconductive layers 23a to 23d are formed to surround the block insulating layers 25a to 25c and the pillar portions 26a.

As shown in FIGS. 3 and 4, the select transistor layer L3 contains electroconductive layers 27a and 27b. The electroconductive layers 27a and 27b are formed in a stripe shape extending in the row direction with a prescribed pitch in the column direction. The pair of electroconductive layers 27a and the pair of electroconductive layers 27b are arranged alternately in the column direction. The electroconductive layers 27a are formed in the upper layer of one of the pillar portions 26a, and the electroconductive layers 27b are formed in the upper layer of the other pillar portion 26a.

The electroconductive layers 27a and 27b are made of polysilicon. The electroconductive layers 27a work as the gates (select gate line SGS) for the select transistor ST2, and the electroconductive layers 27b work as the gates (select gate line SGD) for the select transistor ST1.

As shown in FIG. 4, the select transistor layer L3 has holes 28a and 28b. The holes 28a and 28b are formed through the electroconductive layers 27a and 27b, respectively. Moreover, the holes 28a and 28b are aligned with the memory holes 24, respectively.

FIG. 4 also shows that the select transistor layer L3 contains gate insulating layers 29a and 29b as well as semiconductor layers 30a and 30b. The gate insulating layers 29a and 29b are formed on the side walls facing the holes 28a and 28b, respectively. The semiconductor layers 30a and 30b are formed in a pole shape extending in the vertical direction with respect to the surface of the semiconductor substrate 20 so that they are in contact with the gate insulating layers 29a and 29b, respectively.

For example, the gate insulating layers 29a and 29b are made of silicon dioxide ($SiO_2$) and the semiconductor layers 30a and 30b are made of polysilicon.

As the constitution of the select transistor layer L3 is viewed from another angle, the gate insulating layer 29a is formed to surround the pillar semiconductor layer 30a. The electroconductive layers 27a are formed to surround the gate insulating layer 29a and the semiconductor layer 30a, respectively. The gate insulating layer 29b is formed to surround the pillar semiconductor layer 30b. The electroconductive layer 27b is formed to surround the gate insulating layer 29b and the semiconductor layer 30b.

As shown in FIGS. 3 and 4, the wiring layer L4 is formed in the upper layer of the select transistor layer L3. The wiring layer L4 has a source line layer 31, a plug layer 32, and a bit line layer 33.

The source line layer 31 is formed in a sheet shape extending in the row direction. The source line layer 31 is formed in contact with the upper surface of the pair of electroconductive layers 27a adjacent to each other in the column direction. The plug layer 32 is formed in contact with the upper surface of the electroconductive layer 27b and extending in the vertical direction with respect to the surface of the semiconductor substrate 20. The bit line layer 33 is formed in a stripe shape extending in the column direction with a prescribed pitch in the row direction. The bit line layer 33 is formed in contact with the upper surface of the plug layer 32. For example, the source line layer 31, the plug layer 32, and the bit line layer 33 are made of tungsten (W) or another metal. The source line layer 31 works as the source lines SL explained in FIGS. 1 and 2, and the bit line layer 33 works as the bit lines BL.

Figure 5:
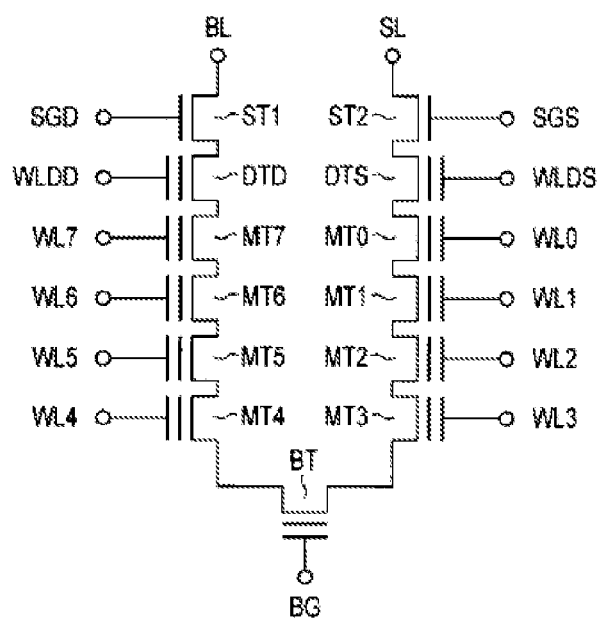
FIG. 5 is a circuit diagram illustrating a NAND string of the first embodiment.

FIG. 5 is a diagram illustrating the equivalent circuit of the NAND strings 18 shown in FIGS. 3 and 4. As shown in the figure, each of the NAND strings 18 has the select transistors ST1, ST2, the memory cell transistors MT0 to MT7, the dummy transistors DTD, DTS, and the back gate transistor BT. As explained above, the memory cell transistor MT is connected in series between the select transistors ST1, ST2. The back gate transistor BT is connected in series between the memory cell transistors MT3 and MT4. The dummy transistor DTD is connected in series between the select transistor ST1 and the memory cell transistor MT7.

The dummy transistor DTS is connected in series between the select transistor ST2 and the memory cell transistor MT0. In data read operation, the dummy transistors DTD, DTS and the back gate transistor BT are kept on. In the write operation, they are turned on as needed.

The control gate of the memory cell transistor MT is connected to the word line WL, the control gates of the dummy transistors DTD, DTS are connected to the dummy word lines WLDD, WLDS, and the control gate of the back gate transistor BT is connected to the back gate line BG. Here, as shown in FIG. 3, the collection of the plural NAND strings 18 arranged in the row direction correspond to the memory groups GP explained in FIG. 2.

1.1.3 About the Row Decoders 11

Figure 6:
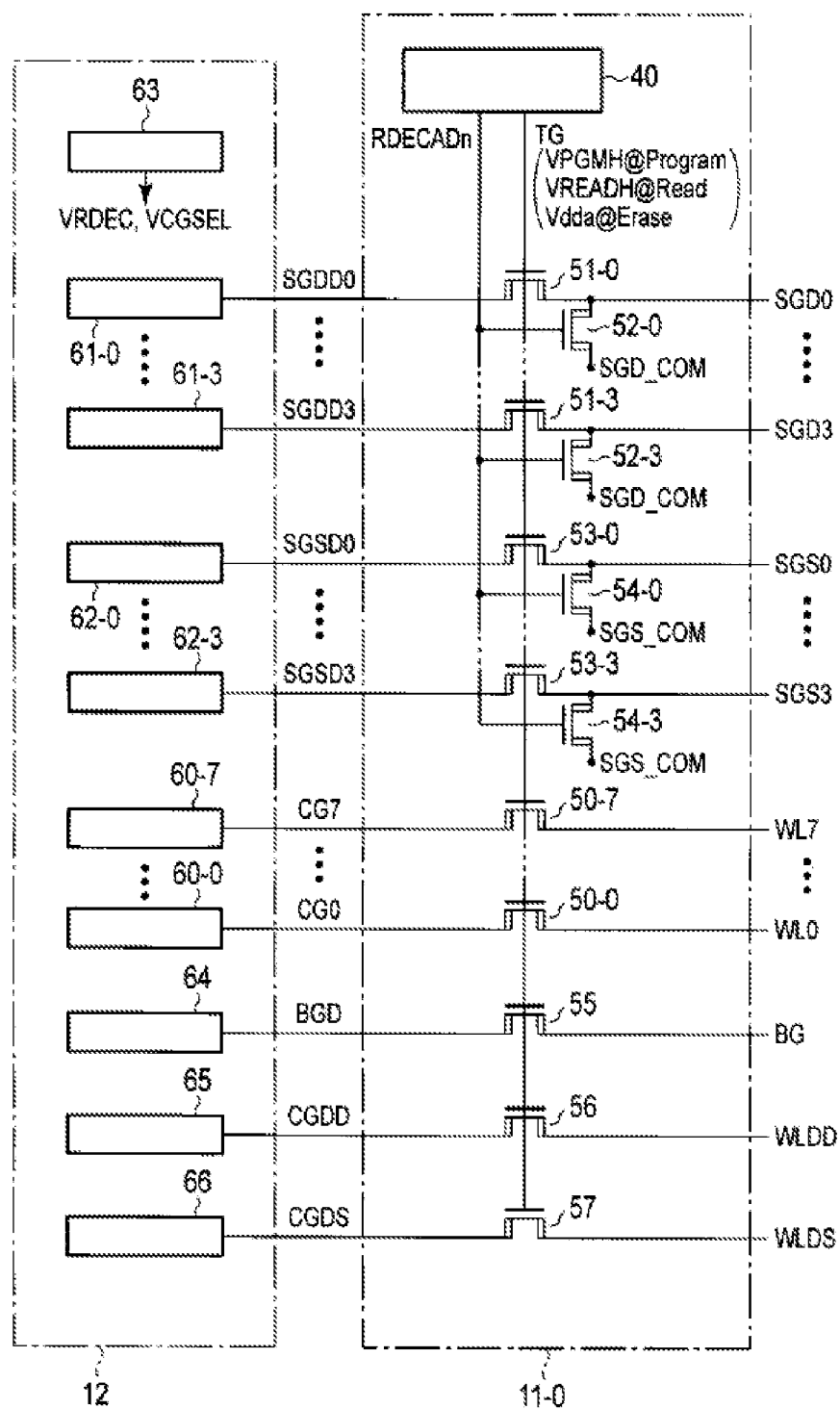
FIG. 6 is a block diagram illustrating a row decoder and a driver circuit of the first embodiment.

In the following, the constitution of the row decoders 11 will be explained. The row decoders 11-0 to 11-3 are arranged corresponding to the blocks BLK0 to BLK3, respectively, and the blocks BLK0 to BLK3 are arranged for selection or non-selection. FIG. 6 is a diagram illustrating the constitution of the row decoder 11-0 and the driver circuit 12. The constitution of the row decoders 11-1 to 11-3 is the same as that of the row decoder 11-0.

As shown in the figure, each of the row decoders 11 has a block decoder 40, high-voltage-rating n-channel MOS transistors 50-54 (50-0 to 50-7, 51-0 to 51-3, 52-0 to 52-3, 53-0 to 53-3, 54-0 to 54-3), and 55 to 57.

About Block Decoder 40

The block decoder 40 decodes a block address given by, for example, the control part 17, in the data write, read and erasing operation. Then, corresponding to the decoding result, signals TG and RDECADn are generated. More specifically, when the block address refers to the block BLK0 corresponding to the row decoder 11-0, the signal TG is asserted (the "H" level in this example), and the signal RDECADn is negated (to the "L" level, such as the negative potential VBB in this example). The voltage of the asserted signal TG is VPGMH in the write operation, it is VREADH in the read operation, and it is the Vdda in the erasing operation. These potentials will be explained later.

When the block address does not refer to the block BLK0 corresponding to the row decoder 11-0, the signal TG is negated (to the "L" level, such as VSS (0 V) in this example), and the signal RDECADn is asserted (to the "H" level in this example).

About Transistor 50

The transistor 50 is explained here. The transistor 50 is for transferring the voltage to the word line WL of the selected block BLK. The transistors 50-0 to 50-7 each have an end of the current path connected to the word lines WL0 to WL7 of the corresponding block BLK0, and the other end is connected to signal lines CG0 to CG7, respectively. The signal TG of the corresponding block decoder 40 is sent to the gate.

Consequently, for example, in the row decoder 11-0 corresponding to the selected block BLK0, the transistors 50-0 to 50-7 turn on, and the word lines WL0 to WL7 are connected to the signal lines CG0 to CG7. On the other hand, in the row decoders 11-1 to 11-3 corresponding to the non-selected blocks BLK1 to BLK3, the transistors 50-0 to 50-7 are turned off, and the word lines WL0 to WL7 are separated from the signal lines CG0 to CG7.

About Transistors 51, 52

The transistors 51, 52 are explained here. The transistors 51, 52 are for transferring the voltage to the select gate line SGD. The transistors 51-0 to 51-3 each have one end of the current path connected to the select gate lines SGD0 to SGD3 of the corresponding block BLK0, and have the other end connected to signal lines SGDD0 to SGDD3, and the signal TG is sent to the gate.

The transistors 52-0 to 52-3 each have one end of the current path connected to the select gate lines SGD0 to SGD3 of the corresponding block BLK0, and have the other end connected to node SGD_COM, and the signal RDEC-ADn is sent to the gate. Here, the node SGC_COM has a negative voltage VBB or the like, in order to turn off the select transistor ST1.

Consequently, in the row decoder 11-0 corresponding to the selected block BLK0, the transistors 51-0 to 51-3 are turned on, and the transistors 52-0 to 52-3 are turned off. Therefore, the select gate lines SGD0 to SGD3 of the selected block BLK0 are connected to the signal lines SGDD0 to SGDD3.

On the other hand, in the row decoders 11-1 to 11-3 corresponding to the non-selected blocks BLK1 to BLK3, the transistors 51-0 to 51-3 are in the off state, and the transistors 52-0 to 52-3 are in on state. Consequently, the signal lines SGDD0 to SGDD3 of the non-selected blocks BLK1 to BLK3 are connected to the node SGD_COM.

About Transistors 53, 54

The transistors 53, 54 are for transferring the voltage to the select gate line SGS. Their connection and operation are equivalent to replacement of the select gate line SGD by the select gate line SGS in the transistors 51, 52.

That is, in the row decoder 11-0 corresponding to the selected block BLK0, the transistors 53-0 to 53-3 are turned on, and the transistors 54-0 to 52-4 are turned off. On the other hand, in the row decoders 11-1 to 11-3 corresponding to the non-selected blocks BLK1 to BLK3, the transistors 51-0 to 51-3 are turned off, and the transistors 52-0 to 52-3 are turned on.

About Transistor 55

The transistor 55 is explained here. The transistor 55 is for transferring the voltage to the back gate line BG. For the transistor 55, one end of the current path is connected to the back gate line BG0 of the corresponding block BLK0, the other end is connected to the signal line BGD, and the signal TG is sent to the gate.

Consequently, in the row decoder 11-0 corresponding to the selected block BLK0, the transistor 55 is turned on, and, in the row decoders 11-1 to 11-3 corresponding to the non-selected blocks BLK1 to BLK3, the transistor 55 is turned off.

About Transistors 56, 57

The transistors 56, 57 are explained here. The transistors 56, 57 are for transferring the voltage to the dummy word lines WLDD, WLDS. For the transistor 56, one end of the current path is connected to the dummy word line WLDD of the corresponding block BLK0, the other end is connected to the signal line CGDD, and the signal TG is sent to the gate. For the transistor 57, one end of the current path is connected to the dummy word line WLDS of the corresponding block BLK0, the other end is connected to the signal line CGDS, and the signal TG is sent to the gate.

Consequently, in the row decoder 11-0 corresponding to the selected block BLK0, the transistors 56, 57 are turned on, and, in the row decoders 11-1 to 11-3 corresponding to the non-selected blocks BLK1 to BLK3, the transistors 56, 57 are turned off.

1.1.4 About Driver Circuit 12

The constitution of the driver circuit 12 will be explained here. The driver circuit 12 transfers the voltage needed for data write, read and erasing to the signal lines CG0-CG7, SGDD0 to SGDD3, SGSD0 to SGSD3, CGDD, CGDS, and BGD.

The driver circuit 12 shown in FIG. 6 has CG drivers 60 (60-0 to 60-7), SGD drivers 61 (61-0 to 61-3), SGS drivers 62 (62-0 to 62-3), voltage driver 63, BG driver 64, CGDD driver 65 and CGDS driver 66.

About Voltage Driver 63

First, the voltage driver 63 is explained. The voltage driver 63 generates voltages VRDEC and VCGSEL adopted in the block decoder 40 and CG driver 60.

The voltage VRDEC is sent to the block decoder 40. Then, the block decoder 40 corresponding to the selected block, outputs the voltage VRDEC as the signal TG. The voltage VCGSEL is sent to the CG driver 60. The VCGSEL includes the voltages VPGM, VCGRV, etc. applied to the selected word line in the data write and read operation.

About CG Driver 60

The CG driver 60 is explained. The CG drivers 60-0 to 60-7 transfer the necessary voltages to the signal lines CG0 to CG7 (word lines WL0 to WL7).

The CG driver 60 corresponding to the selected word line WL transfers the voltage VCGSEL=VPGM to the corresponding signal line CG in program operation. In addition, in the read operation, it transfers the voltage VCGSEL=VCGRV to the corresponding signal line CG. These voltages are then transferred to the word line WL via the current path of the transistors 50 in the row decoders 11.

In addition, the CG driver 60 corresponding to the non-selected word line transfers voltage VPASS or voltage VISO (such as 0 V) to the corresponding signal line CG in the program operation. In the read operation, the voltage VREAD is transferred to the corresponding signal line CG. Then, these voltages are transferred to the non-selected word line WL via the current path of the transistors 50 in the row decoders 11.

In the erasing operation, all of the CG drivers 60 transfer voltage Vera_w1 (such as 0.5 V) to the corresponding signal line CG.

The voltages VPASS and VREAD are voltages that turn on the memory cell transistors MT irrelevant to the held data, and the voltage VISO is a voltage that turns off the memory cell transistors MT irrelevant to the held data. The voltages VPGMH, VREADH, and Vdda applied as the signal TG, are voltages higher than the voltages VPGM, VREAD, and Vera_w1, respectively, and they are voltages that enable transfer of the voltages VPGM, VREAD and Vera_w1 by the transistor 50.

The signal lines CG0 to CG7 may be shared among the various blocks BLK. That is, the four word lines WL0 belonging to the four blocks BLK0 to BLK3 may also be driven by the same CG driver 60-0 via the transistors 50-0 of the corresponding row decoders 11-0 to 11-3. The same is true for the other signal lines CG1 to CG7. This also takes place for the other wirings SGDD, SGSD, BGD, CGDD, CGDS. In the following, this case will be explained as an example.

About SGD Driver 61

The SGD driver 61 is explained here. The SGD drivers 61-0 to 61-3 transfer the necessary voltages to the signal lines SGDD0 to SGDD3 (select gate lines SGD0 to SGD3).

When the SGD driver 61 corresponds to the NAND strings 18 containing the selected cells, the SGD driver 61 outputs voltage VSG. This voltage is transferred via the current path of the corresponding transistor 51 to the corresponding select gate line SGD. The voltage VSG is a voltage that turns on the select transistor ST1 in the read operation, and turns on the select transistor ST1 corresponding to the write data in the write operation.

In the erasing operation, the SGD driver 61 outputs a relatively high voltage that is needed for generating GIDL (gate induced drain leakage). The operation for erasing will be explained in detail in Embodiment 2 and thereafter.

About SGS Driver 62

The SGS driver 62 is explained here. The SGS drivers 62-0 to 62-3 transfer the necessary voltages to the signal lines SGSD0 to SGSD3 (select gate lines SGS0 to SGS3).

When the SGS driver 62 corresponds to the NAND strings 18 containing the selected cells, it outputs the voltage VSG in the data read operation. This voltage is transferred via the current path of the corresponding transistor 53 to the corresponding select gate line SGS. In the read operation, the voltage VSG turns on the select transistor ST2. Also, in the write operation, the transistor 54 is turned on, and the negative voltage VBB is transferred to the corresponding select gate line SGS.

In the erasing operation, the SGS driver 62 outputs a relatively high voltage for generating the GIDL. For the erasing operation, a detailed explanation will be presented in Embodiment 2.

About CGDD Driver 65, CGDS Driver 66, and BG Driver 64

In the following, an explanation is made on the CGDD driver 65, the CGDS driver 66, and the BG driver 64. The drivers 64, 65, 66 output the voltage VPASS in the data write operation, and they output the voltage VREAD in the data read operation. These voltages are transferred via the current paths of the transistors 55, 56, 57 to the back gate line BG and the dummy word lines WLDD, WLDS.

The operation of the transistors 64 and 65 in the erasing operation will be explained in detail in Embodiment 2 and thereafter.

1.1.5 About Voltage Generator 15

The voltage generator 15 has plural charge pump circuits. The voltage generator 15 generates voltages VPGMH, VPGM, VPASS in the write operation; it generates voltages VREAH, VREAD, VCGRV in the read operation; and it generates the voltage Vera in the erasing operation.

1.2 About Operation of Semiconductor Storage Device 1

A brief account is given here on the operation of the NAND type flash memory 1.

1.2.1 About Read Operation

Figure 7:
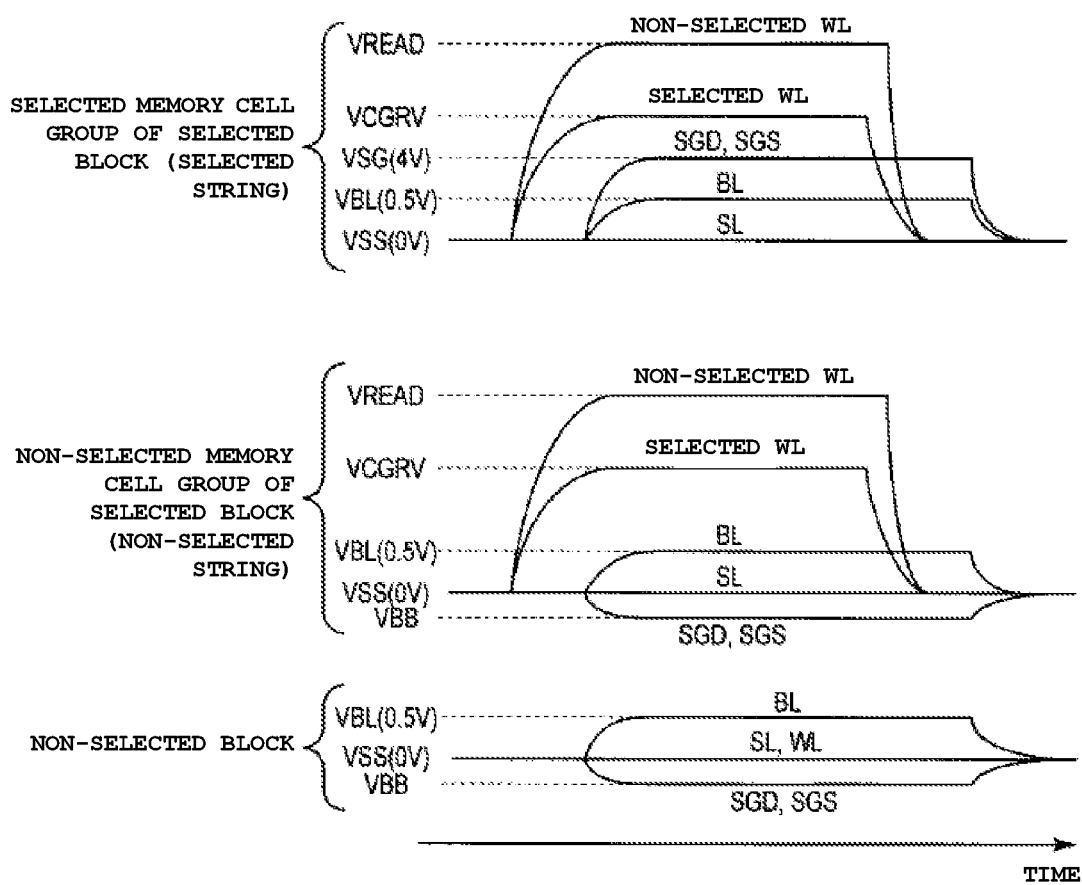
FIG. 7 is a time chart of various types of signals in the first embodiment.

First, with reference to FIG. 7, the read operation of data will be explained. FIG. 7 is a time chart illustrating potentials on the various wirings in the read operation.

As shown in FIG. 7, the CG driver 60 generates the voltages VCGRV, VREAD. The voltage VCGRV is a voltage that should be applied to the selected word line, and this voltage corresponds to the data to be read (threshold level) (VREAD>VCGRV).

In the row decoder 11 corresponding to the selected block, the transistor 50 is turned on, so that these voltages VCGRV and VREAD are transferred to the word line WL. On the other hand, in the non-selected block, the corresponding transistor 50 is turned off so that the word line WL is electrically floating.

Then, voltages are transferred to the select gate lines SGD, SGS. In the selected memory group of the selected block, by the transistors 51, 53, the voltage VSG (e.g., 4 V) is transferred to the select gate lines SGD, SGS. As a result, the select transistors ST1, ST2 are turned on. In the non-selected memory group of the selected block, by the transistors 51, 53, the voltage VBB is transferred to the select gate lines SGD, SGS. As a result, the select transistors ST1, ST2 are turned off. In addition, in the non-selected block, by the transistors 52, 54, the voltage VBB is transferred to the select gate lines SGD, SGS. Consequently, the select transistors ST1, ST2 are turned off.

The source lines SL are set at VSS (0 V), and a voltage VBL (0.5 V) is applied to the bit lines BL.

As explained above, the voltage VCGRV is applied to the control gate of the selected memory cell, and the current path is electrically connected to the bit line BL and the source line SL. If the selected memory cell is not on, a current flows from the bit line BL to the source line SL. This current is detected by the sense amplifier 13 as the read operation.

1.2.2 About the Write Operation

Figure 8:
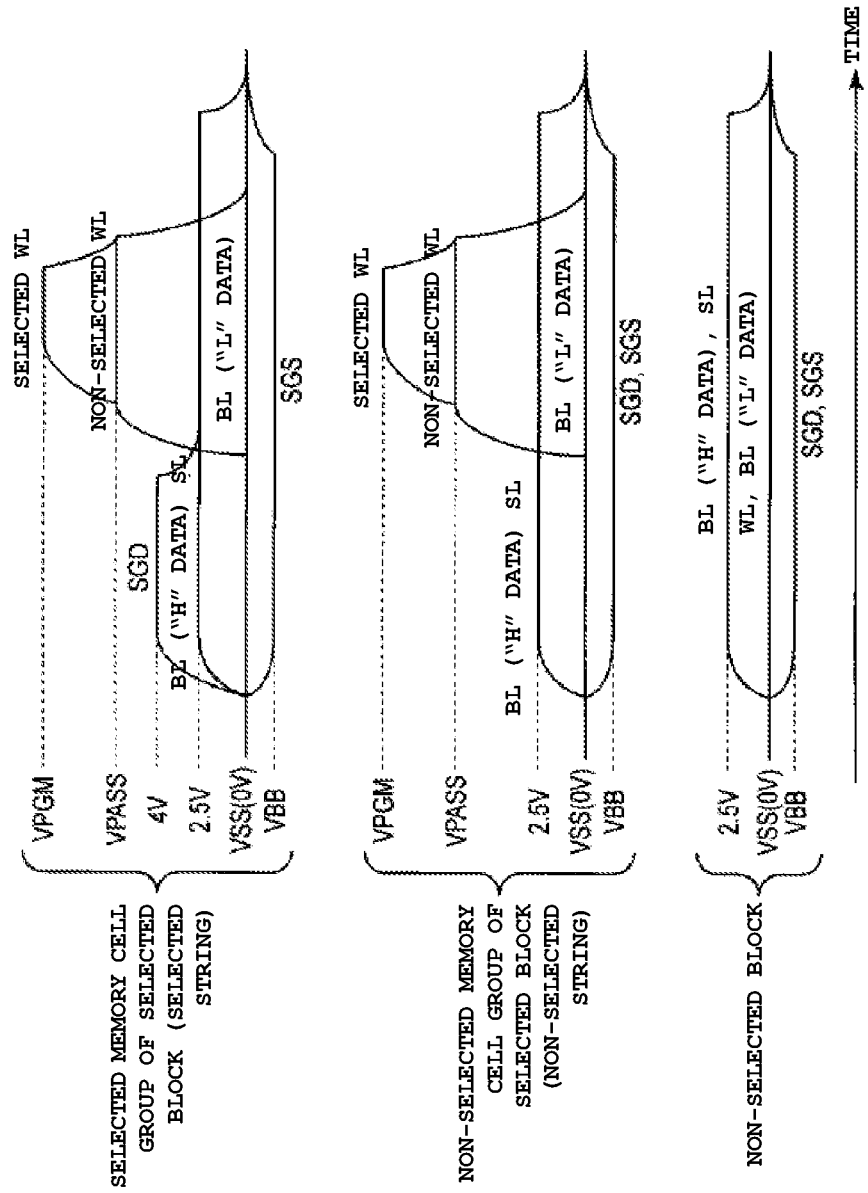
FIG. 8 is a time chart of the various types of signals in the first embodiment.

The write operation is explained here with reference to FIG. 8. FIG. 8 is a time chart illustrating the potentials of the various wirings in the write operation.

As shown in FIG. 8, the sense amplifier 13 transfers the write data to the various bit lines BL. When charge is injected into the charge accumulating layer, the "L" level (e.g., VSS=0 V) is applied to the bit lines BL. If not, the "H" level (e.g., VDD=2.5 V) is applied. Here, a voltage of, e.g., 2.5 V is applied by the driver 14 on the source lines SL.

Also, in the row decoders 11, the block address BA is decoded by the block decoder 40; in the selected block, TG="H" level is set, and the transistors 50, 51, 53 of the row decoders 11 are turned on. In the row decoder 11 corresponding to the non-selected block, TG="L" level (e.g., VBB) is set, so that transistors 50, 51, 53 are turned off, and transistors 52, 54 are turned on.

Consequently, in the non-selected block, by transistors 52, 54, the negative voltage VBB is transferred to the select gate lines SGD, SGS, and both the select transistors ST1, ST2 are cut off.

In the selected block, by the SGD driver 61 and SGS driver 62, the voltage VSG (e.g., 4 V) is transferred to the select gate line SGD corresponding to the memory group containing the selected page, and the negative voltage VBB is transferred to the select gate line SGS. Consequently, in the corresponding memory group, the select transistor ST1 is on, and ST2 is off. The negative voltage VBB is transferred to the select gate lines SGD, SGS corresponding to the other memory groups. As a result, in these memory groups, both the select transistors ST1, ST2 are turned off.

Then, the voltage VSG decreases from 4 V to about 2.5 V. This voltage turns on the select transistor ST1 when the "L" data is transferred to the bit lines BL, and it cuts off the select transistor when the "H" data is transferred.

Next, the CG driver 60 transfers the voltage to the various signal lines CG. That is, the CG driver 60 corresponding to the selected word line transfers the VPGM, and the CG driver 60 corresponding to the non-selected word line transfers the VPASS (or VISO). The VPGM is a high voltage for injecting charge into the charge accumulating layer. The VPASS is a voltage that turns on the memory cell transistors irrelevant to the held data (where VPASS<VPGM). The VISO is a voltage that turns off the memory cell transistor irrelevant to the held data (VISO<VPASS). As a result, in the selected block, the transistor 50 is turned on, so that these voltages are transferred to the word lines WL0 to WL7. In the non-selected block, the transistor 50 is in the off state, so that these voltages are not transferred to the word lines WL. That is, the word lines WL0 to WL7 of the non-selected block enter the electrically floating state.

As explained above, in the selected memory cell, the voltage VPGM is applied to the control gate, and the channel is set at 0 V. As a result, a charge is injected into the charge accumulating layer, and the threshold level of the selected memory cell rises. In the non-selected memory cell, the channel becomes electrically floating, and its potential rises due to coupling with the periphery. Consequently, there is no variation in the threshold level of the selected memory cell. In the following, the operation of injection of a charge to the charge accumulating layer will be called "program" operation.

As discussed above, data are written en bloc with respect to the plural memory cell transistors (page) connected to the same word line WL in a certain memory group.

1.2.3 About Write Operation Mode

The write operation explained in 1.2.2 is executed continuously with respect to plural pages corresponding to the size of the data to be written. In this case, with respect to the writing of data in plural pages in any sequence, the NAND type flash memory 1 related to the present embodiment has two operation modes. In the following section, these operation modes will be explained.

1.2.3.1 First Write Mode

A first write mode will be explained first. In the present specification, the first write mode will be called "WL increment mode". In the first write mode, the word lines in a certain memory group GP are, first, sequentially selected, and, after all of the word lines in the corresponding memory group GP, another memory group GP is selected.

Figure 9:
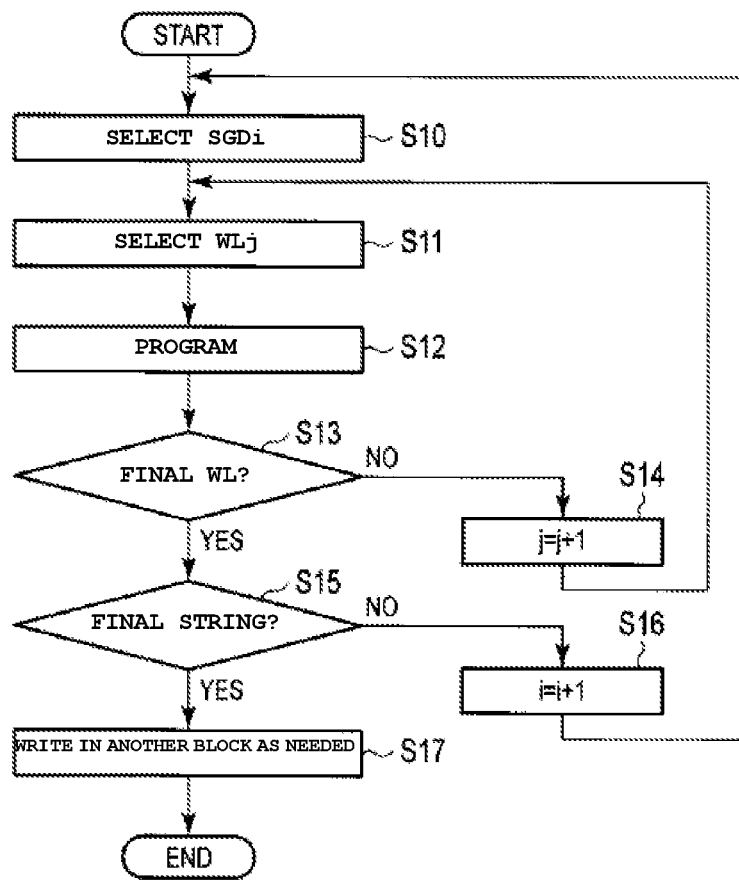
FIG. 9 is a flow chart illustrating a write operation of the first embodiment.

FIG. 9 is a flow chart illustrating the write operation according to the first write mode. As shown in the figure, in the NAND type flash memory 1, corresponding to the row address received from the external controller, certain select gate line SGDi (i is a natural number, and it is in the range of 0 to 3 in this example) and word line WLj (j is a natural number, and it is in the range of 0 to 7 in this example) are selected (steps S10, S11). Then, as explained with reference to FIG. 8, the data are programmed in page units (step S12).

In the data write operation, the word lines WL are selected sequentially from that nearest the select gate line SGS in the NAND string 18. Consequently, when the data are then written, the word line WL (j+1) is selected (steps S14, S11), and the program is executed (step S12).

However, when data are written starting from the word line nearest the select gate line SGD in the NAND string 18, that is, in this example, when data are written in the word line WL7 (when YES in step S13), another memory group GP is selected (step S16). That is, the select gate line SGD (i+1) is selected (steps S16, S10), and the operation after step S11 is repeated.

After data are written in all of the memory groups GP0 to GP3, as needed, data are written in another block (step S17).

Figure 10:
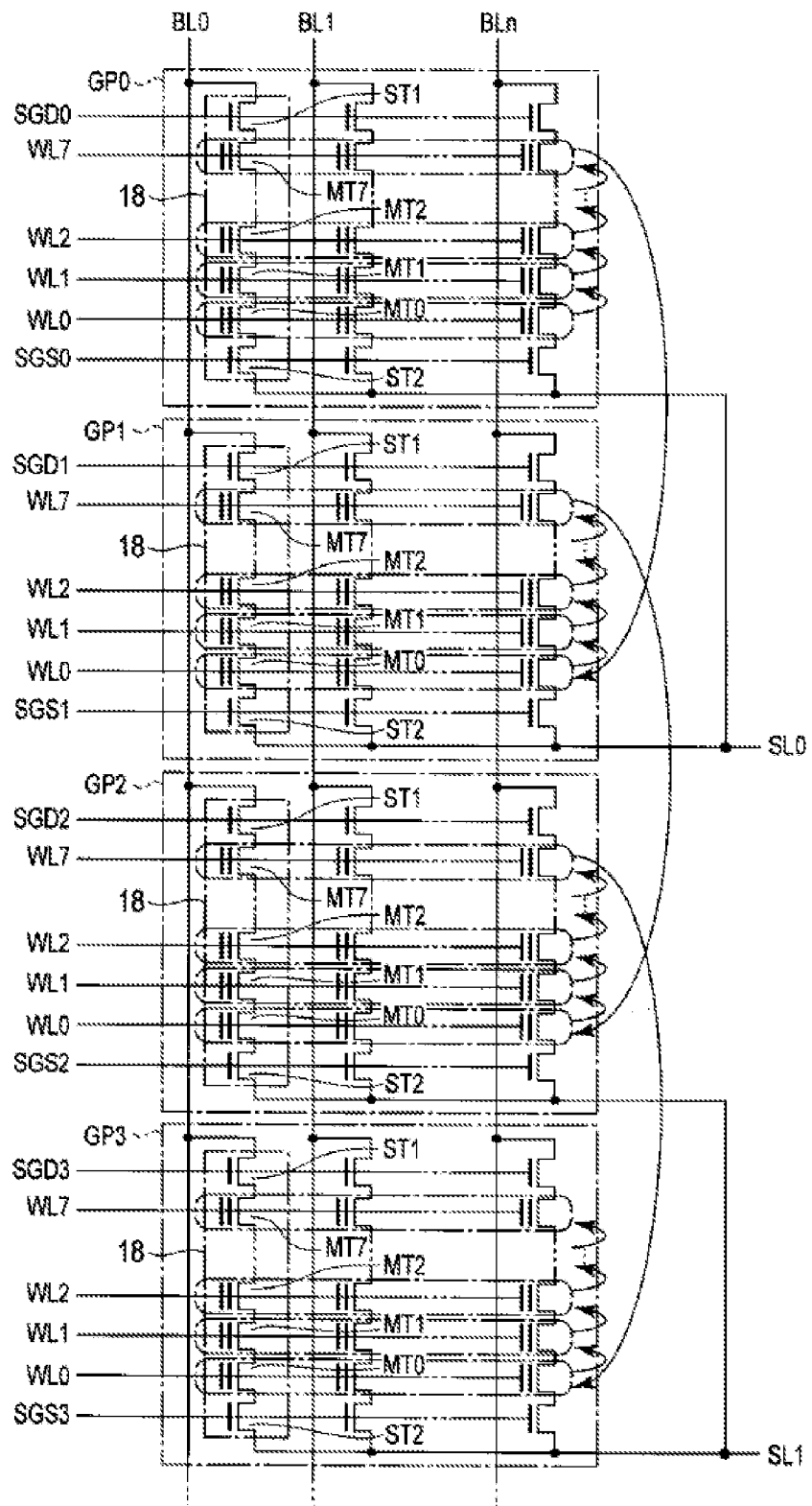
FIG. 10 is a circuit diagram illustrating the memory cell array of the first embodiment.

FIG. 10 is a circuit diagram illustrating the block BLK0. In the figure, the arrow indicates the write order of the data in the first write mode. As shown in the figure, first, in the state when the select gate line SGD0 is selected, the word line WL0 is selected, and the data are written in the corresponding page. Then, as the word line address (the page address) is incremented, the word lines WL1 to WL7 are sequentially selected, and the data are written in these pages.

After the writing of data in the memory cells connected to the word line WL7 of the memory group GP0, the memory group GP1 is selected. That is, the select gate line SGD1 is selected. Then, while the select gate line SGD1 is selected, the word lines WL0 to WL7 are sequentially selected, and the data are written in these pages.

Next, in the same way, the memory groups GP2, GP3 are sequentially selected, and the data are written in the page units.

The same is true for the other blocks BLK1 to BLK3.

1.2.3.2 Second Write Mode

Here, a second write mode will be explained. In the present specification, the second write mode is also called "string increment mode". According to the second write mode, in a certain block, a certain word line is selected sequentially for all of the memory groups GP, and, after the word line has been selected for all of the memory groups, the next word line is selected.

Figure 11:
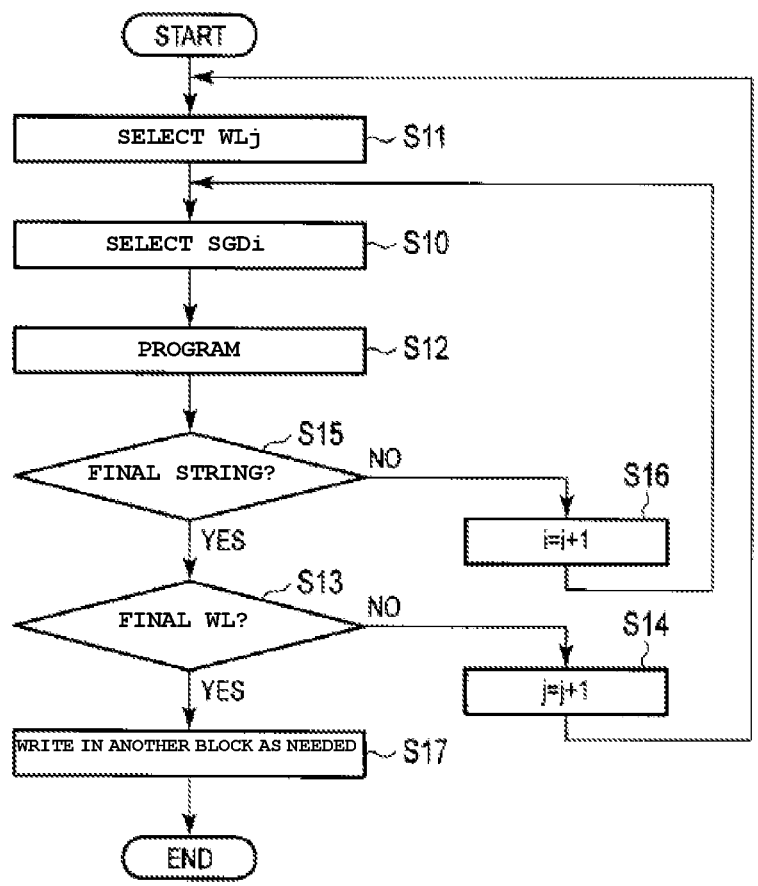
FIG. 11 is a flow chart illustrating the write operation of the first embodiment.

FIG. 11 is a flow chart illustrating the write operation according to the second write mode. As shown in the figure, in the NAND type flash memory 1, corresponding to the row address received from the external controller, a certain select gate line SGDi and word line WLj is selected (steps S10, S11). Then, as explained with reference to FIG. 8, the data are programmed in the page units (step S12).

According to the second write mode, then, the word line WLj of the memory group GP (i+1) is selected (steps S16, S10), and the program is executed (step S12).

After the data are written in all of the memory groups for the word line WLj, meaning, after the data are written in all of the word lines WLj in the memory groups GP0 to GP4 in this example (when YES in step S15), the next word line is selected (step S14). That is, the word line WL (j+1) is selected (steps S14, S11), and the operation of step S10 and thereafter are repeated.

After the data are written in all of the memory groups GP0 to GP3, as needed, the data are written in another block (step S17).

Figure 12:
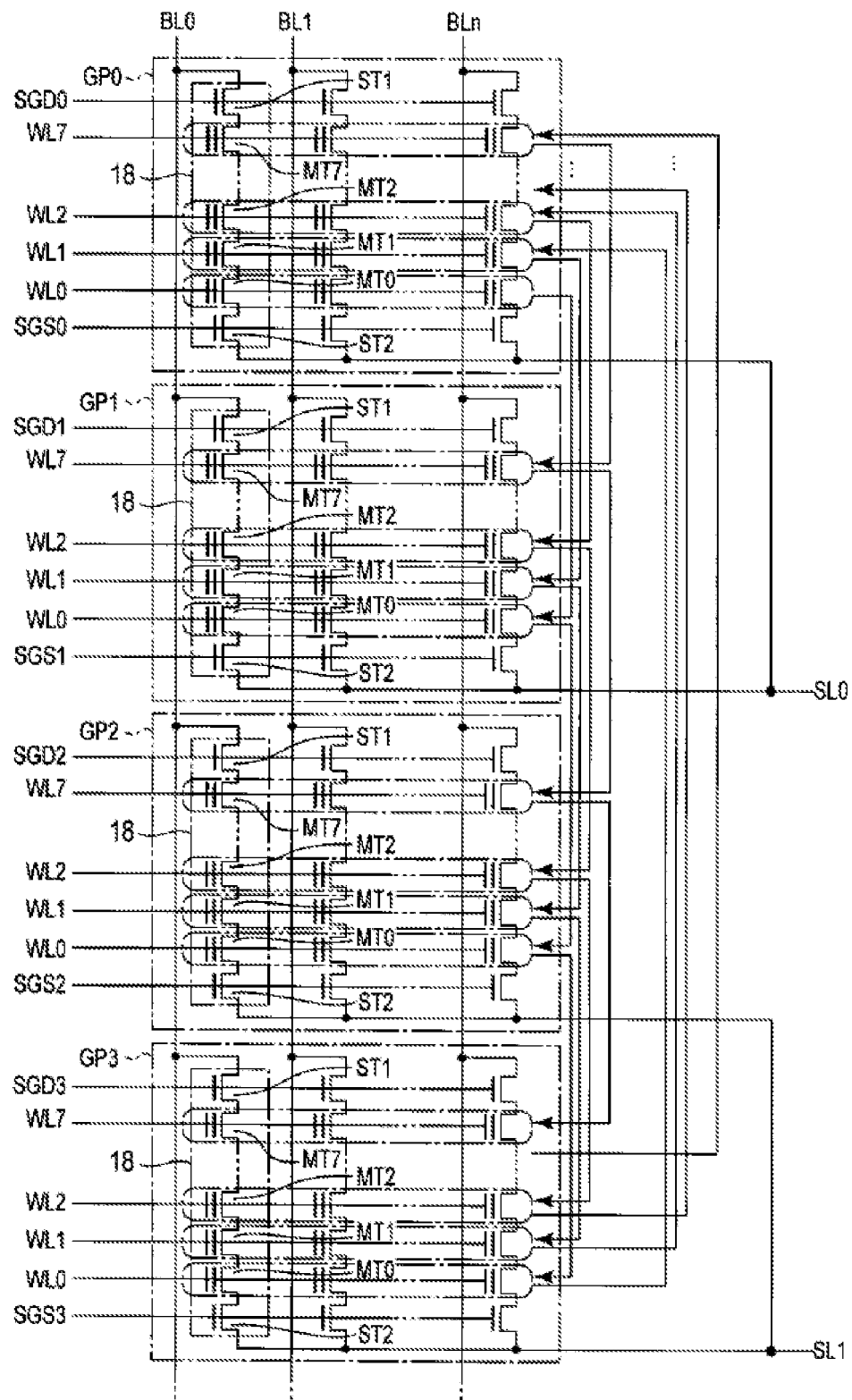
FIG. 12 is a circuit diagram illustrating the memory cell array of the first embodiment.

FIG. 12 is a circuit diagram illustrating the block BLK0. In this figure, the arrow indicates the order of data writing according to the second write mode. As shown in the figure, first, in the state where the select gate line SGD0 is selected, the word line WL0 is selected, and the data are written in the corresponding page. Then, in the state where the word line WL0 is selected, the string address (the address for assigning the memory group GP, meaning the address for selecting the select gate line SGD) is incremented, so that the memory groups GP1 to GP3 are sequentially selected. The data are written in these pages. The word line WL0 of the next memory group GP1 is selected, the data of the corresponding page are programmed, the word line WL0 of the next memory group GP2 is selected, and the data are programmed in the corresponding page. Finally, the word line WL0 of the memory group GP3 is selected, and the data are programmed to the corresponding page.

After the data are programmed in the word line WL0 of the memory group GP3, the next word line WL1 is selected. While the word line WL1 is selected, the select gate lines SGD0 to SGD3 are sequentially selected.

Then, just as mentioned previously, the word lines WL2 to WL7 are sequentially selected, and the data are written in the page units. The same operation is carried out for the other blocks BLK1 to BLK3.

1.3 Effects of the Present Embodiment

Embodiments disclosed herein can improve the operational reliability of the semiconductor storage device. The effects are as follows.

In the three-dimensional laminated type NAND type flash memory, plural NAND strings 18 are arranged in each block, and plural NAND strings 18 are connected to each bit line.

According to the embodiments, two schemes may be adopted as the increment method of the page address of the NAND type flash memory with this constitution. Specifically, a WL increment mode (the first write mode) and a string increment mode (the second write mode).

In the WL increment mode, first, the word line address in the plural NAND strings 18 sharing the select gate line is incremented. As the final address is reached for the word line address, the string address in the same block is incremented. As explained above, the string address is the address for selecting the select gate line, and it is the address for selecting a certain NAND string among the plural NAND strings 18 connected to the same bit line.

Alternatively, in the string increment mode, first the string address in the same block is incremented. Then, as the string address reaches the final address, the word line address is incremented.

Figure 13:
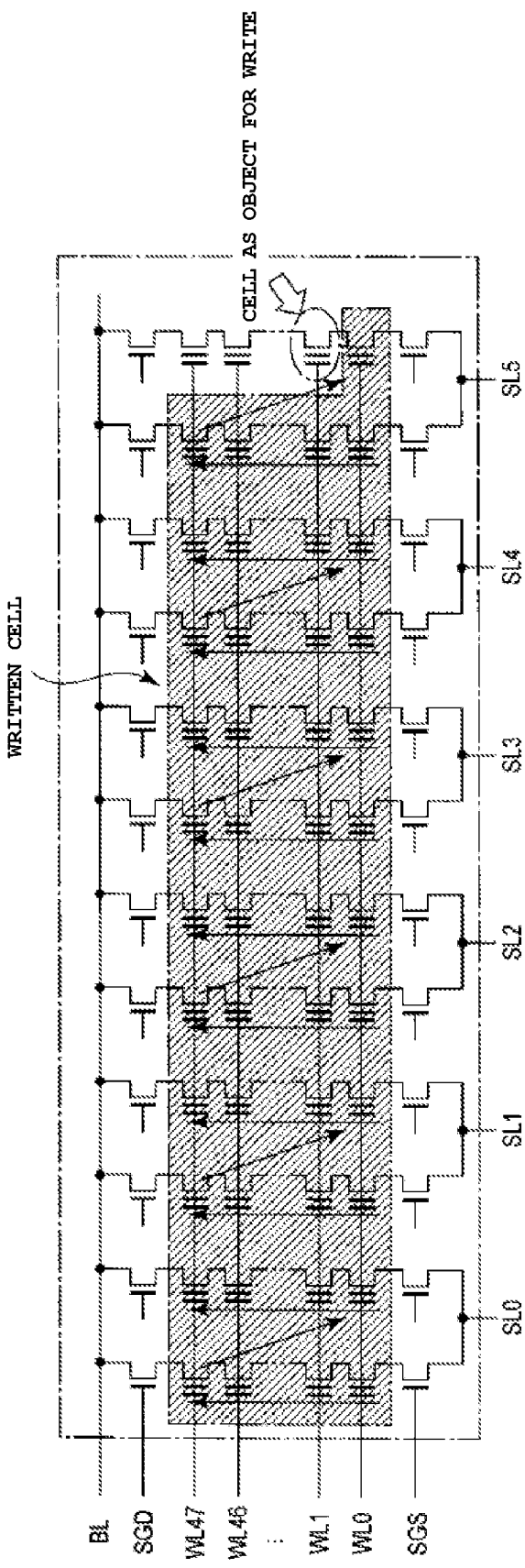
FIG. 13 is a circuit diagram illustrating the memory cell array of the first embodiment.
Figure 14:
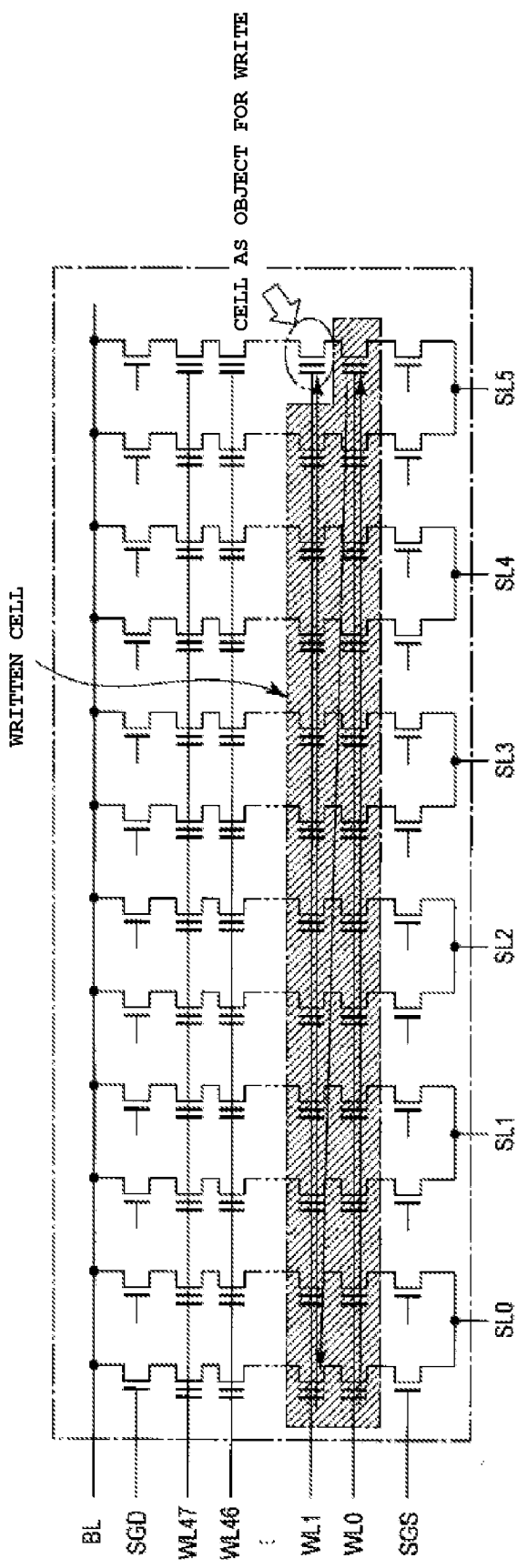
FIG. 14 is a circuit diagram illustrating the memory cell array of the first embodiment.

The two methods have their respective unique advantages. FIGS. 13 and 14 are both circuit diagrams illustrating the block. They show the plural NAND cells connected to one bit line BL. As shown in FIGS. 13 and 14, one block contains 12 memory groups, and there are 48 word lines. They illustrate the write operation carried out in the WL increment mode and string increment mode, respectively. The hatched portions in the figures correspond to the memory cell transistors where data have been written, and the arrows in the figures show the order of data writing. Also shown in the figures, in the same block, the word lines WL are commonly connected among the NAND strings. On the other hand, the select gate lines SGD, SGS are selected independent from each other.

As shown in FIG. 13, in the WL increment mode, the data are written in each NAND string. Consequently, erasing can be carried out in the NAND string unit (memory group unit). In other words, as the data erasing unit is defined as the block, it is possible to change the block to various sizes. In this case, it is possible to carry out erasing at a block size smaller than that in the related art.

On the other hand, as shown in FIG. 14, in the string increment mode, data are written in each word line. That is, when data writing is carried out in a certain memory cell transistor MT, data are not written in the memory cell transistor MT connected to the non-selected word lines nearer the drain side than the selected word line (word lines WL2 to WL47 in the example shown in FIG. 14). Therefore, it is possible to suppress the program disturbance, and it is possible to improve the data write reliability.

By adopting the two write modes with their advantages, it is possible to further improve the operation reliability of the NAND type flash memory 1.

2. Embodiment 2

Here, the semiconductor storage device related to Embodiment 2 will be explained. This embodiment relates to the data erasing method in the Embodiment 1.

2.1 About Principle of the Erasing Method

Figure 15:
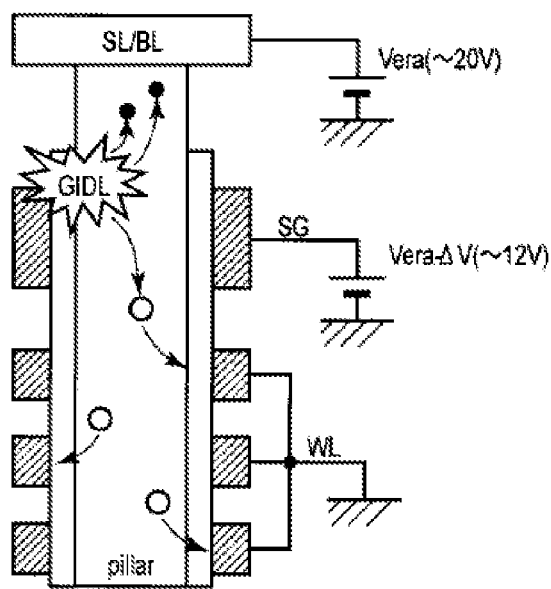
FIG. 15 is a cross-sectional view illustrating a NAND string according to a second embodiment.

A principle of erasing data in the three-dimensional laminated, NAND type flash memory 1 related to the present embodiment will be explained with reference to FIG. 15. FIG. 15 is a cross-sectional view illustrating a portion of a region of the NAND string. It shows the source lines SL and the bit lines BL, as well as pillar portions of NAND strings 18 (regions where the channels of the memory cells are formed). In the figure, "SG" stands for select gate line SGD or SGS.

The three-dimensional laminated, NAND type flash memory differs from the planar NAND type flash memory that has the memory cells formed two-dimensionally on a semiconductor substrate in that there exists no well that allows application of the erasing voltage Vera. Also, the pillars are formed of an intrinsic type silicon. Consequently, in the data erasing operation, holes are generated due to GIDL taking place at the select gate end. Among hole-electron pairs generated by GIDL, the holes enter the pillars with a low voltage. As a result, the potential of the pillars increases to the erasing voltage Vera. Then, by setting the potential of the word lines WL at a low potential, data can be erased.

2.2 About Erasing Method Related to the Present Embodiment

For the NAND type flash memory 1 related to the present embodiment, two erasing methods may be adopted. As in the explanation for Embodiment 1, here, they refer to erasing in block units (first erasing method) and the erasing in less-than-block-size unit (sub-block unit) (second erasing method). In the following, these two methods will be explained.

2.2.1 About First Erasing Method

Figure 16:
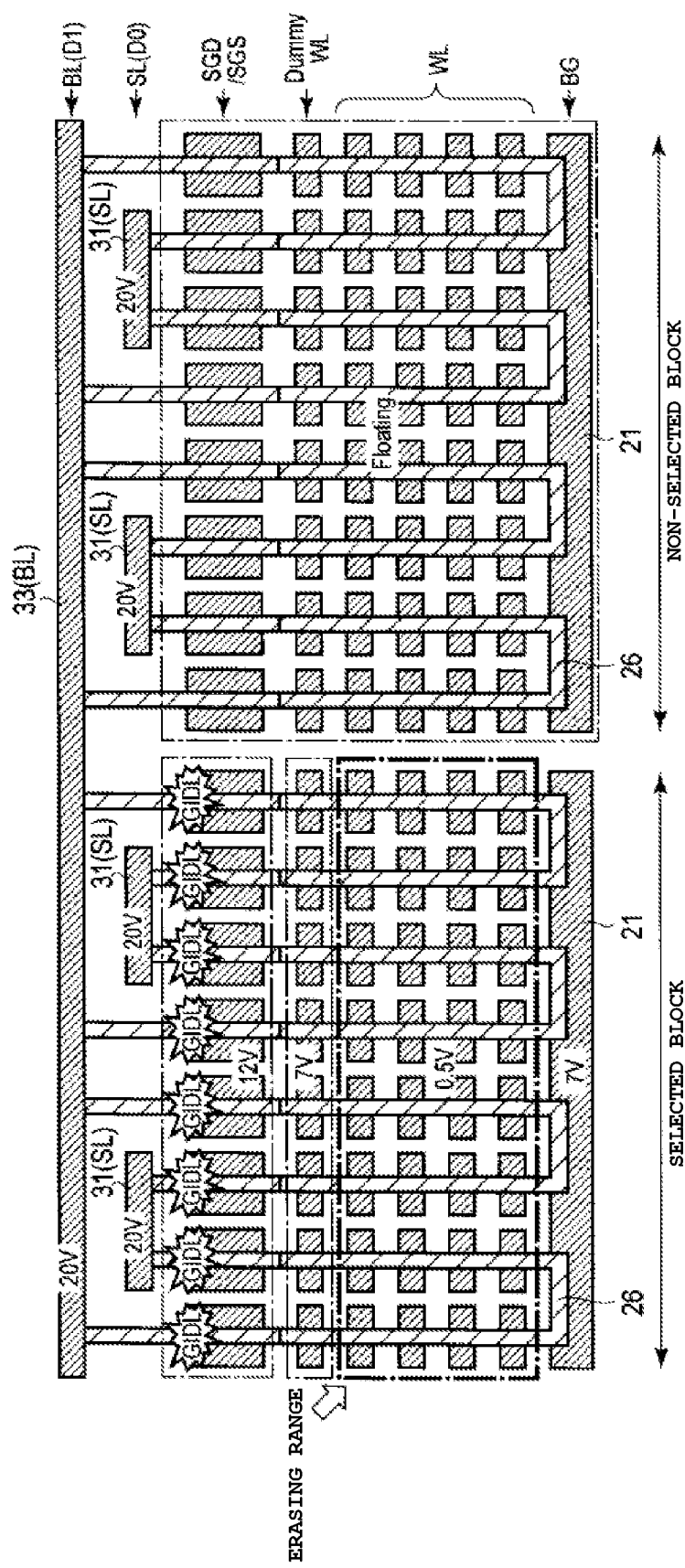
FIG. 16 is a cross-sectional view illustrating a memory cell array of the second embodiment.

The first erasing method is explained here. According to this method, data are erased in block units. FIG. 16 is a cross-sectional view illustrating two blocks. It shows that plural NAND cells are connected to one bit line BL.

First, the selected block will be explained. In the selected block, voltage Vera_w1 (e.g., 0.5 V) is sent to all of the word lines WL0 to WL7 by the CG driver 60. Also, by the SGD driver 61 and SGS driver 62, a voltage VSGera (e.g., 12 V, VSGera<Vera) is applied to all of the signal lines SGDD0 to SGDD3, SGS0 to SGS3. Additionally, by the CGDD driver 65 and CGDS driver 66, a voltage Vmid (e.g., 7 V, Vera_w1<Vmid<VSGera) is applied to all of the dummy word lines WLDD, WLDS. Also, the BL/SL driver 14 applies the voltage Vera (e.g., 20 V) on the bit line BL and source lines SL0, SL1. As a result, the GIDL is generated near the select gate lines SGD, SGS.

Now, the non-selected block will be explained. In the non-selected block, too, the bit line BL and the source lines SL0, SL1 are common with the selected block. Therefore, the Vera is applied to them. However, for the non-selected block, an "L" level is set for the signal line TG in the row decoder 11. Consequently, all of the word lines WL0 to WL7, all of the signal lines SGDD0 to SGDD3, SGS0 to SGS3, and all of the dummy word lines WLDD, WLDS are in an electrically floating state. As a result, the GIDL is not generated.

As explained above, the data in the same block can be erased en bloc.

2.2.2 About Second Erasing Method

Figure 17:
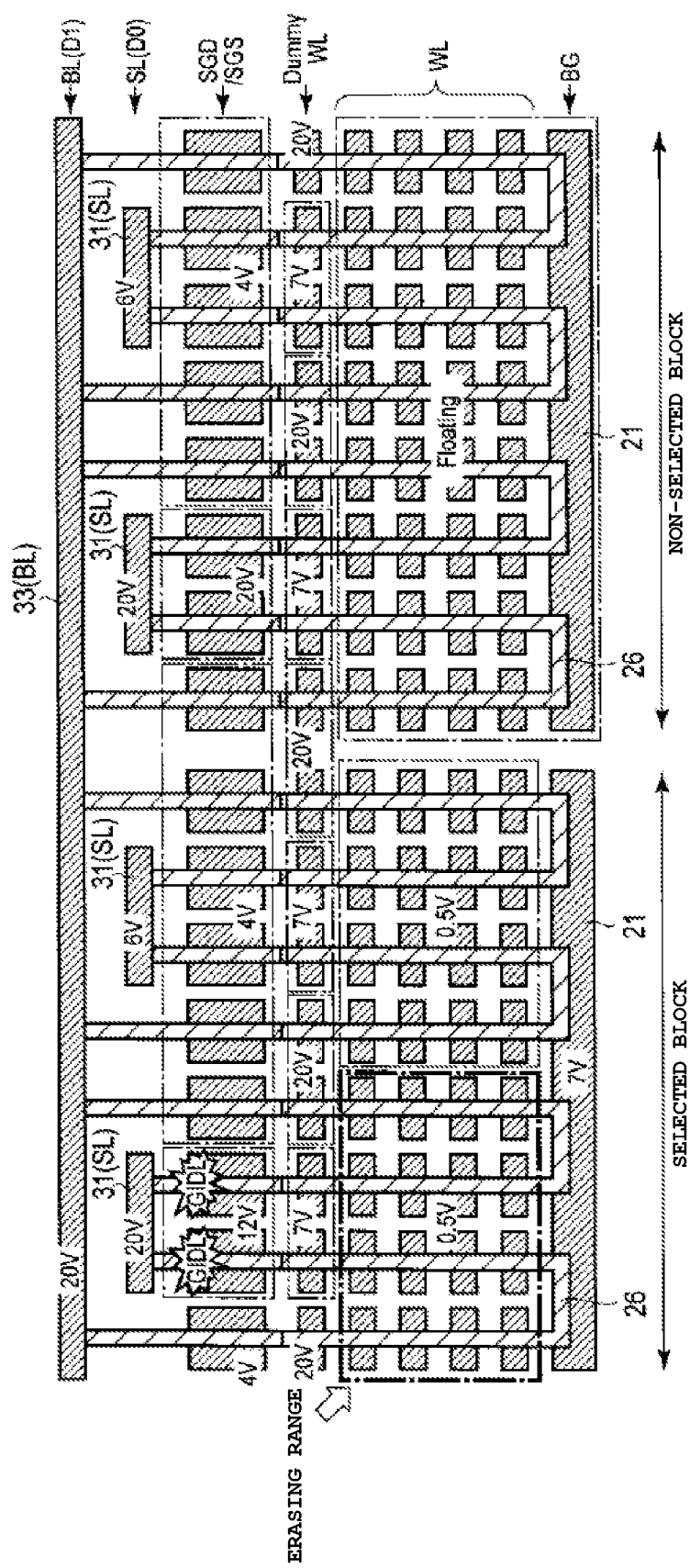
FIG. 17 is a cross-sectional view illustrating the memory cell array of the second embodiment.

The second erasing method is explained here. According to this method, data erasing is carried out in sub-block unit, or, more specifically, in memory groups GP units. FIG. 17 is a cross-sectional view illustrating two blocks. It shows that plural NAND cells are connected to one bit line BL. In particular, FIG. 17 shows the case when data erasing is carried out in unit of two memory groups GP.

First, the selected block will be explained. In the selected block, by the CG driver 60, the voltage Vera_w1 (e.g., 0.5 V) is sent to all of the word lines WL0 to WL7. Also, the voltage Vmid is sent to the dummy word line WLDS by the CGDS driver 66. Additionally, by the CGDD driver 65, a voltage Vhigh (e.g., 20 V just as the Vera) is sent to the dummy word line WLDD. Also, by the SGS driver 62, the voltage VSGera is sent to the select gate line SGS connected to the selected string. By the SGD driver 61 and SGS driver 62, a voltage VSGinhibit1 (e.g., 4 V) is sent to the other select gate lines SGD, SGS. The voltage VSGinhibit1 is a voltage with a magnitude appropriate to ensure that GIDL is not generated. The BL/SL driver 14 applies the voltage Vera on the bit line BL, it applies the voltage Vera on the source lines SL connected to the selected string, and it applies a voltage Vera_us1 (<Vera) on the source lines SL connected to the non-selected strings.

As a result of what is explained above, the GIDL is generated near the select gate line SGS where the voltage VSGera is applied, and the data in the corresponding NAND string are erased. On the other hand, even for the NAND strings in the same block, the GIDL is not generated in the NAND string where the voltage VSGinhibit1 is applied to both the select gate lines SGS, SGD, so that the data are not erased.

The non-selected block is explained here. Just as in the first erasing method, in this case, all of the word lines WL0 to WL7 are set in the floating state. The voltage Vmid is sent to the dummy word line WLDS by the CGDS driver 66 and, the voltage Vhigh is sent to the dummy word line WLDD by the CGDD driver 65. In the select gate line SGD, by the SGD driver 61, a voltage VSGinhibit2 (>VSGinhibit1, such as 20 V equal to Vera) is sent to the select gate line SGD, and, by the SGD driver 61 and SGS driver 62, the voltage VSGinhibit1 is sent to other select gate lines SGD, SGS. As with the voltage VSGinhibit1, the voltage VSGinhibit2 is a voltage with an appropriate level to ensure that the GIDL is not generated.

As a result of this operation, the GIDL is not generated in any NAND string, and the data are not erased.

2.2.3 About Relationship with Write Mode

Figure 18:
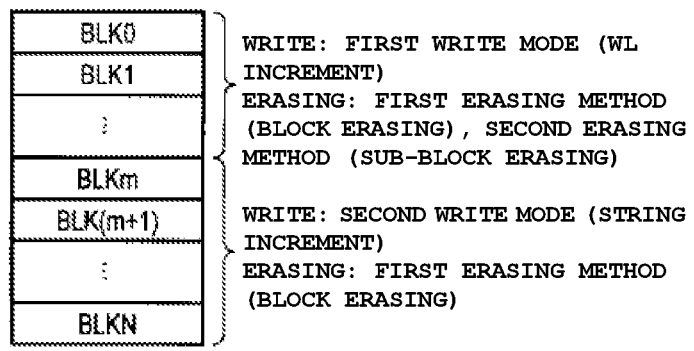
FIG. 18 is a block diagram illustrating a memory cell array of the second embodiment.

Here, the relationship between the first and second erasing methods and the write mode is explained with reference to Embodiment 1 and will be explained with reference to FIG. 18. FIG. 18 is a block diagram illustrating the memory cell array 10 of the NAND type flash memory 1.

As shown in the figure, the memory cell array 10 has N (N is a natural number of 2 or larger) blocks BLK0 to BLKN. Among them, data are written in the blocks BLK0 to BLK (m−1) in the first write mode (WL increment mode) and, data are written in the blocks BLKm to BLKN in the second write mode (string increment).

In this case, when the data in the blocks BLK0 to BLKN written in the first write mode are to be erased, the second erasing method that erases the data in sub-block unit (as well as the first erasing method) is adopted. On the other hand, when the data in the blocks BLKm to BLKN, written in the second write mode, are to be erased, the first erasing method that erases the data in block unit is adopted, while the second erasing method is not adopted.

2.3 Effects of Present Embodiment

As explained above, when data are written in the first write mode explained with reference to Embodiment 1, in addition to erasing in block unit, it is also possible to erase the data in sub-block unit.

On the other hand, when the data are written in the second write mode, it is preferred that erasing be carried out in block units. This is because the page address continuously strides the plural memory groups GP. Here, if data are erased in the unit of memory groups GP, and the data are to be written in the erased region, it is hard to assign the corresponding region according to the page address.

3. Embodiment 3

The semiconductor storage device and the controller related to Embodiment 3 are explained here. The present embodiment relates to the controller that controls the NAND type flash memory 1 explained with reference to Embodiment 2.

3.1 About Constitution of Memory System 3.1.1 About Overall Constitution of Memory System A constitution of the memory system containing the memory controller related to the present embodiment is explained here.

A memory system 100 shown in the figure has host equipment 110, a memory controller 120 and a NAND type flash memory 130.

The host equipment 110 accesses the NAND type flash memory 130 by sending a command to the memory controller 120. Then, via the memory controller 120, data are written in the NAND type flash memory 130, data are read from the NAND type flash memory 130, and the data of the NAND type flash memory 130 are erased. Examples of the host equipment 110 include personal computers, digital cameras, cell phones, etc.

In response to the command from the host equipment 110, the memory controller 120 sends commands to the NAND type flash memory 130 to read, write and erase the data. The memory space of the NAND type flash memory 130 is also managed.

The NAND type flash memory 130 is the memory 1 explained with reference to Embodiments 1 and 2.

For example, the memory controller 120 and the NAND type flash memory 130 may form the same semiconductor device. Examples include SD™ and other memory cards, SSDs (solid state drives), etc. The host equipment 110 and the memory controller 120 may also form the same electronic equipment, and examples include the personal computer, digital camera, cell phone, etc.

3.1.2 About the Constitution of the Memory Controller 120

Figure 19:
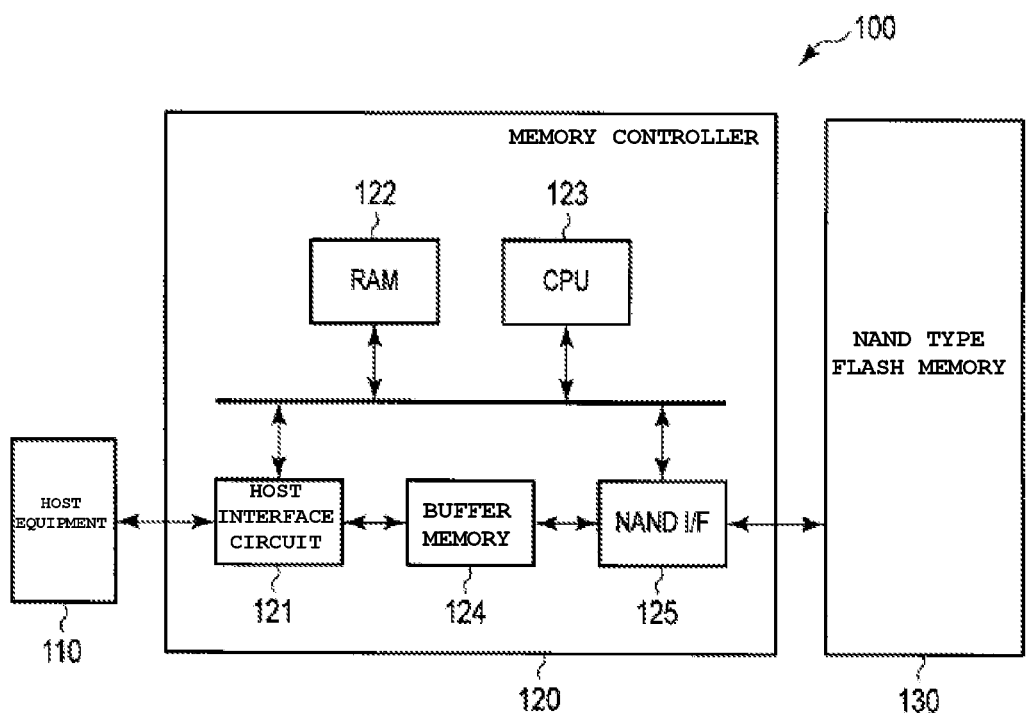
FIG. 19 is a block diagram illustrating the memory system according to a third embodiment.

The constitution of the memory controller 120 will be further explained here with reference to FIG. 19. As shown in the figure, the memory controller 120 has a host interface circuit 121, an internal memory 122, a processor (CPU) 123, a buffer memory 124, and a NAND interface circuit 125.

The host interface circuit 121 is connected to the host equipment 110 via a host interface, and it carries out communication with the host equipment 110. The commands and data received from the host equipment 110 are transferred to the CPU 123 and the buffer memory 124, respectively. Also, as an answer to the command of the CPU 123, the data in the buffer memory 124 are sent to the host equipment 110.

The NAND interface circuit 125 is connected to the NAND type flash memory 130 via a NAND interface, and it carries out communication with the NAND type flash memory 130. Then, the command received from the CPU 123 is sent to the NAND type flash memory 130, and, in the write operation, the data written in the buffer memory 124 are sent to the NAND type flash memory 130. During the read operation, the data read from the NAND type flash memory 130 are sent to the buffer memory 124.

The CPU 123 controls the overall operation of the memory controller 120. For example, when a read command is received from the host equipment 110, according to the command, a read command is issued based on the NAND interface. The same takes place in write and erasing. The CPU 123 also executes various processing operations for managing the NAND type flash memory 130, such as ware leveling, etc.

For example, the internal memory 122 is a DRAM or other semiconductor memory, and it is adopted as an operation region of the CPU 123. The internal memory 122 holds the firmware and various types of management tables, etc. for management of the NAND type flash memory.

3.2 About Operation of Memory Controller 120

The operation of the memory controller 120 is explained here. FIG. 20 is a flow chart illustrating the operation of the memory controller 120 during data write operation. The flow is the same as that in the data erasing operation.

As shown in the figure, the memory controller 120 receives the write command, the address, and the write data from the host equipment 110 in the host interface circuit 121 (step S30). Then, CPU 123 determines whether the data should be written in the WL increment mode (step S31).

When it is determined that the write is carried out in the WL increment mode (when YES in step S31), the CPU 123 issues a first write command, and the command is sent to the NAND type flash memory 130 (step S32). In addition, the address and the data are sent to the NAND type flash memory 130. The received first write command is held in the command register 16 in the NAND type flash memory 130. As an answer to it, the control part 17 has the data written according to the WL increment mode.

When it is determined that write is carried out in the string increment mode (when NO in step S31), the CPU 123 issues a second write command, and sends it to the NAND type flash memory 130 (step S33). In addition, the address and the data are sent to the NAND type flash memory 130. The received second write command is held in the command register 16 in the NAND type flash memory 130. As an answer to it, the control part 17 writes the data according to the string increment mode.

3.3 About Method for Selecting Write Mode

Here, a few examples of the determination method explained with reference to step S31 shown in FIG. 20 will be explained.

3.3.1 About First Example

The first example will be explained here. FIG. 21 is a schematic diagram illustrating the selection table held in, e.g., the internal memory 122.

The selection table shown in the figure holds the relationship between a logic address received from the host equipment 110 and the write method and erasing method to be adopted. According to the example shown in FIG. 21, the memory space with the logic addresses of 0x0000 to 0x0FFF is defined as a first region, and the WL increment mode and the block erasing method or the sub-block erasing method are adopted. The memory space with the logic addresses of 0x1000 to 0xFFFF is defined as a second region, and the string increment mode and the block erasing method are adopted.

Figures 22, 23:
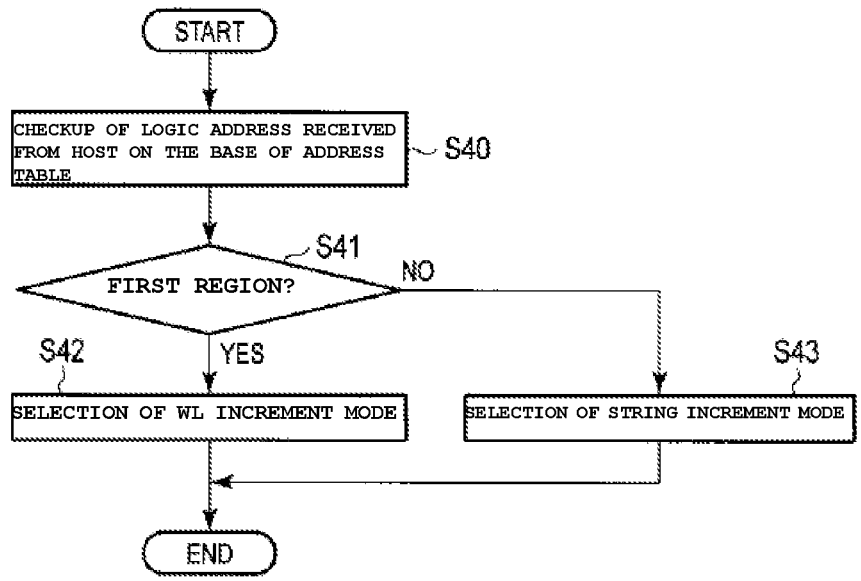
FIG. 22 is a flow chart illustrating a write operation of the third embodiment.
FIG. 23 is a schematic diagram illustrating the selection table of the third embodiment.

FIG. 22 is a diagram illustrating an example of step S31. As shown in the figure, the CPU 123 takes the selection table as the reference (step S40). Then, it determines whether the logic address received from the host equipment 110 corresponds to the first region (step S41). If YES, the CPU 123 selects the WL increment mode (step S42), and, if NO, that is, if it corresponds to the second region, the CPU 123 selects the string increment mode (step S43).

3.3.2 About the Second Example

The second example is explained here. FIG. 23 is a schematic diagram illustrating the selection table held in, e.g., the internal memory 122.

The address sent from the host equipment 110 to the memory controller 120 is a logic address. The memory controller 120 converts the logic address to a physical address, and outputs the obtained physical address to the NAND type flash memory 130 in steps S32, S33. The physical address assigns the actual column and page in the memory cell array 10.

The selection table in this example holds the relationship between the physical address and the write method and the erasing method. In the example shown in FIG. 23, the memory space with physical addresses of 0x0000 to 0x0FFF are defined as the first region, and the WL increment mode as well as the block erasing method or the sub-block erasing method are adopted. The memory space with physical addresses of 0x1000 to 0xFFFF are defined as the second region, and the string increment mode and the block erasing method are adopted.

FIG. 24 is a diagram illustrating an example of step S31. As shown in the figure, the CPU 123 converts the received logic address to the physical address (step S44). The CPU 123 then takes the selection table as a reference (step S45). Next, the CPU 123 determines whether the physical address corresponds to the first region (step S41). If YES, the CPU 123 selects the WL increment mode (step S42), and, if NO, that is, if it corresponds to the second region, the string increment mode is selected (step S43)

3.3.3 About Third Example

Here, the third example is explained. FIG. 25 is a schematic diagram illustrating the selection table held in, e.g., the internal memory 122.

The selection table in this example holds the relationship between the write data size and the write method and erasing method that should be adopted. In the example shown in FIG. 25, if the write data size Sdata (byte) is less than a prescribed threshold Sth (byte), the WL increment mode and the erasing method or the sub-block erasing method are adopted. If the size is over the Sth (byte), the string increment mode and the block erasing method are adopted.

Figures 26, 27:
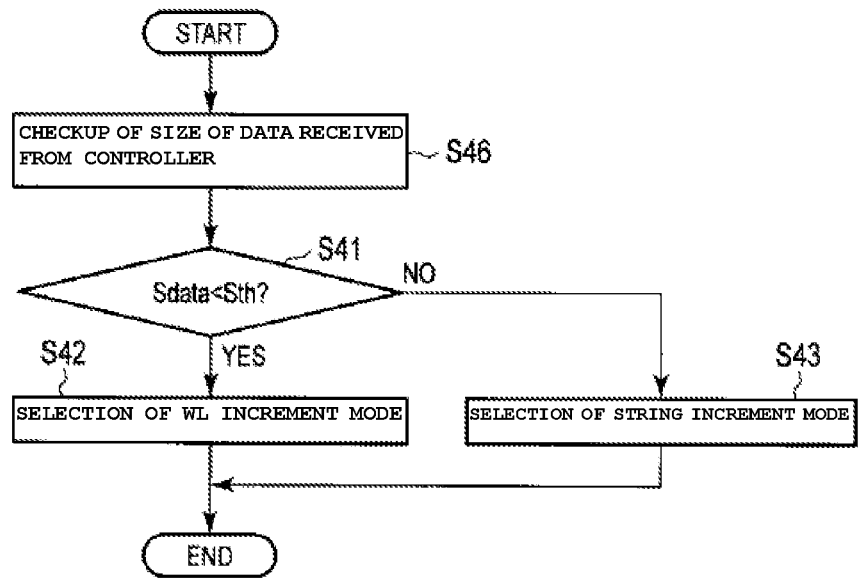
FIG. 26 is a flow chart illustrating the write operation of the third embodiment.
FIG. 27 is a schematic diagram illustrating the selection table of the third embodiment.

FIG. 26 is a diagram illustrating an example of step S31. As shown in the figure, the CPU 123 takes the selection table as a reference, and checks the received write data size (step S48). Then, the CPU 123 determines whether the write data size Sdata is less than the threshold Sth (step S47). If YES, the CPU 123 selects the WL increment mode (step S42), and, if NO, that is, if it corresponds to the second region, the string increment mode is selected (step S43).

3.3.4 About Fourth Example

Here, the fourth example is explained. The fourth example is about determination of step S31 carried out for the NAND type flash memory 130. FIG. 27 is a schematic diagram illustrating the selection table held in, e.g., the control part 17 of the NAND type flash memory 130.

The selection table of this example holds the relationship between the block address and the write method and erasing method that should be adopted. In the example shown in FIG. 27, the region of blocks BLK0 to BLK511 is defined as the first region, and, for the first region, the WL increment mode and the block erasing method or sub-block erasing method are adopted. The region of blocks BLK512 to BLK2042 is defined as the second region, and, for the second region, the string increment mode and the block erasing method are adopted.

Figure 28:
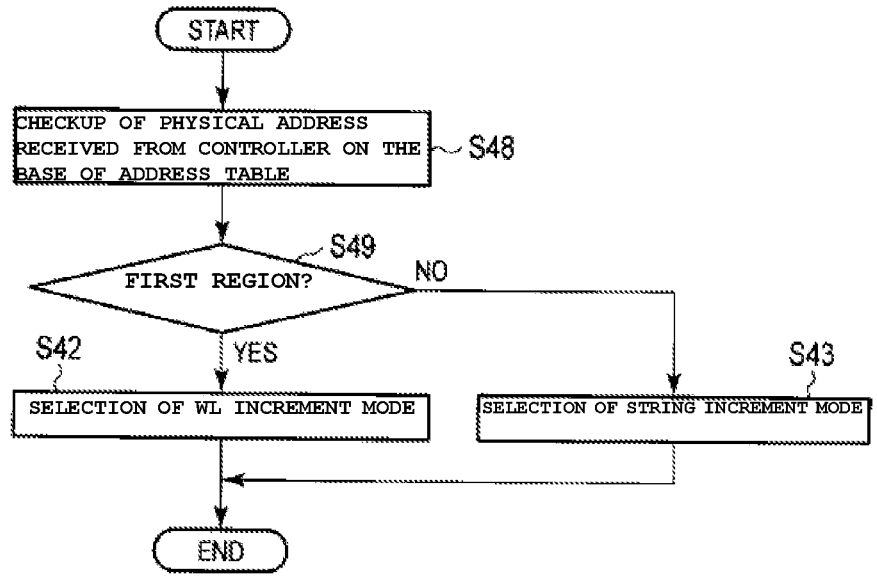
FIG. 28 is a flow chart illustrating the write operation of the third embodiment.

FIG. 28 is a flow chart illustrating the operation of the control part 17 of the NAND type flash memory 130. As shown in the figure, the control part 17 receives from the memory controller 120 the write command, the physical address, and the write data (step S48). Then, the control part 17 takes the selection table as a reference, and determines whether the received physical address corresponds to the first region (step S49). If YES, the control part 17 executes the write sequence according to the WL increment mode (step S42), and, if NO, the write sequence is executed according to the string increment mode (step S43).

3.4 Effects of the Present Embodiment

As explained above, it is possible to execute Embodiments 1 and 2 by the memory controller 120.

However, the control method by the memory controller 120 is not limited to the example. Any appropriate methods may be adopted. For instance, the selection table explained with reference to FIG. 21, FIG. 23, FIG. 25 and FIG. 27 may be updated by the CPU 123 or the host equipment 110. That is, for example, the threshold of the block is preset, and, when an idle block belonging to the first region is decreased to less than the threshold, the idle block belonging to the second region may be allotted to the first region. The opposite case may also take place. The following scheme may also be adopted: instead of management by address, a flag may be set for each block. Then, in the block belonging to the first region, the flag is set at "1", and, in the block belonging to the second region, the flag is set at "0". Various other management methods may be adopted as well. Additionally, although the above is an explanation only for the operation of writing in Embodiment 3, the same operation may be carried out in erasing too.

Figure 29:
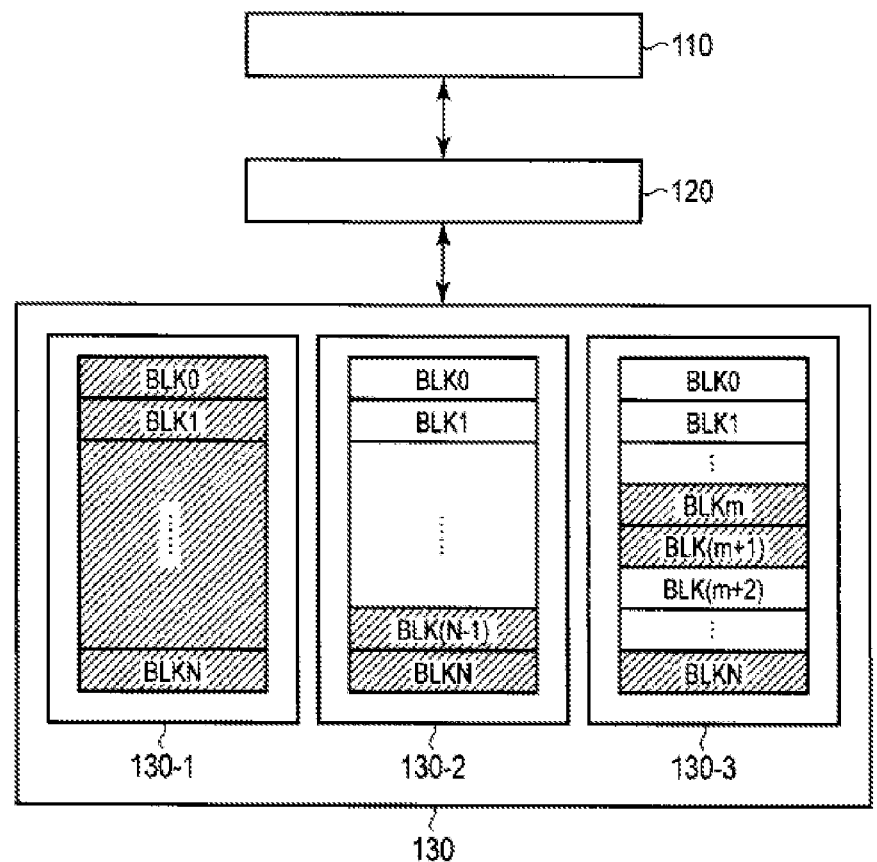
FIG. 29 is a block diagram illustrating the memory system of the third embodiment.

Moreover, the NAND type flash memory 130 may also have plural chips. This example is shown in FIG. 29. FIG. 29 is a block diagram illustrating the memory system. As shown in the figure, the NAND type flash memory 130 has plural semiconductor chips 130-1 to 130-3, which each have the constitution shown in FIG. 1. As shown in the figure, the hatched region is the first region, and the remaining region is the second region. In this way, different managements may be carried out for the chips, respectively. In this case, a selection table is set for each chip.

4. Embodiment 4

Here, the semiconductor storage device and the controller related to Embodiment 4 are explained. This embodiment relates to a control method of the NAND type flash memory 130 by the memory controller 120 explained with reference to Embodiment 3 above.

4.1 About the SLC/MLC Control

Figure 30:
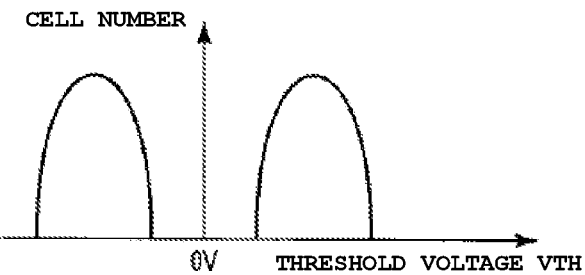
FIG. 30 is a graph illustrating threshold distribution of memory cells according to a fourth embodiment.
Figure 31:
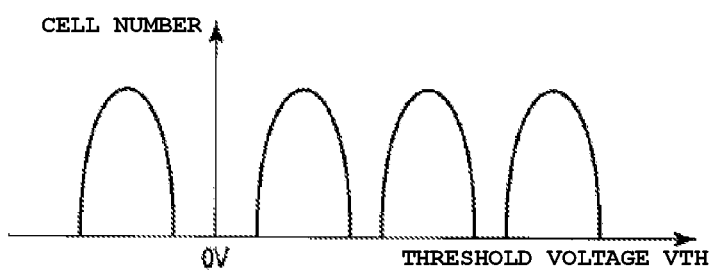
FIG. 31 is a graph illustrating the threshold distribution of the memory cells of the fourth embodiment.

Each of the memory cell transistors MT of the NAND type flash memory 130 related to this embodiment can hold a 1-bit data or a 2- or more-bit data. FIG. 30 shows the threshold distribution of the memory cell transistors MT when the 1-bit data (binary format) are held, and FIG. 31 shows the threshold distribution of memory cell transistors MT when the 2-bit data (four-value format) are held. In the following, write of the 1-bit data is called "SLC (Single Level Cell) system", and write of the 2- or more-bit data is called "MLC (Multi-Level Cell) system".

Figure 32:
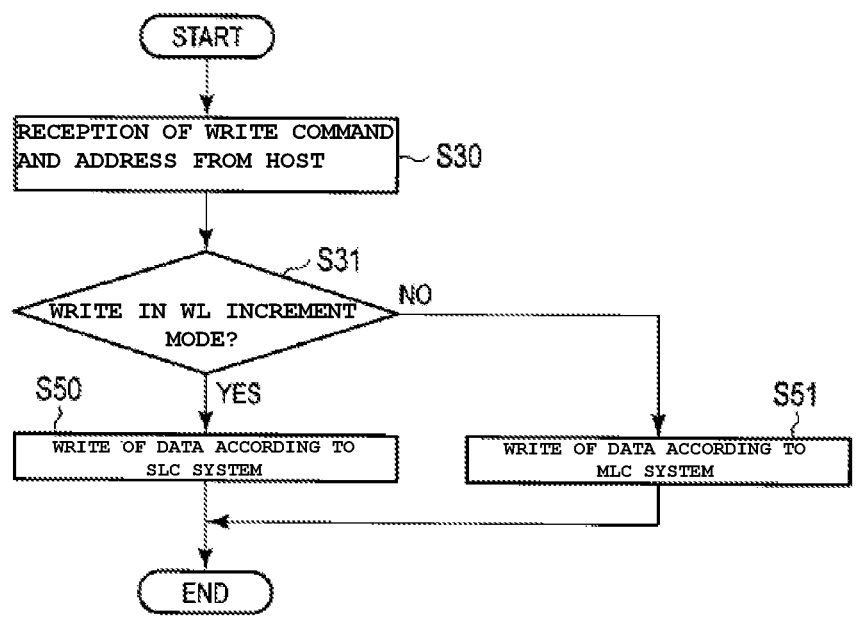
FIG. 32 is a flow chart illustrating a write operation of the fourth embodiment.

FIG. 32 is a flow chart illustrating the operation of the memory controller 120 in the data write operation. If the result of the determination made in step S31 is that the WL increment mode is adopted, the CPU 123 has the data written using the SLC system. On the other hand, when it is determined that the string increment mode is adopted, the CPU 123 has the data written using the MLC system.

For example, when the first write command is issued in step S32 as shown in FIG. 20, the NAND type flash memory 130 executes writing using the SLC system. On the other hand, if the second write command is issued in step S33, the NAND type flash memory 130 executes write according to the MLC system. That is, the method explained in FIGS. 21 to 28 can be adopted as the method for selecting the WL increment mode and the string increment mode.

4.2 About Control of Self Boost System

Figure 33:
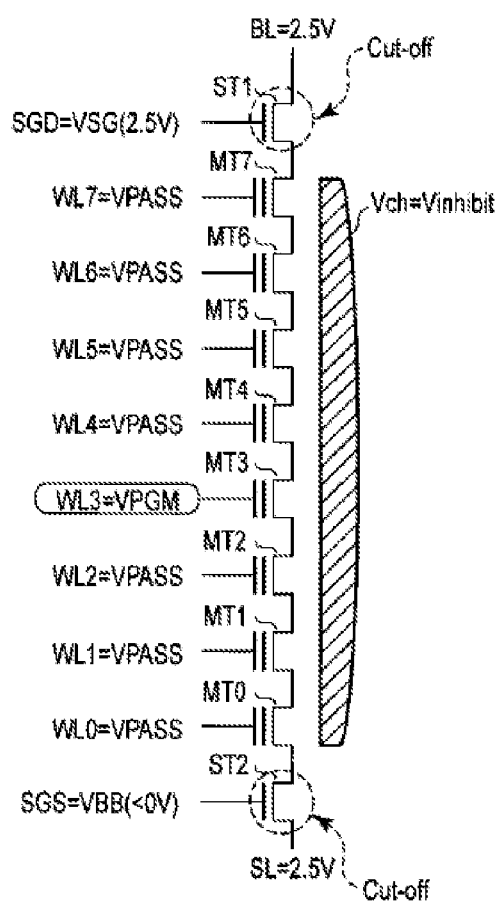
FIG. 33 is a circuit diagram illustrating a NAND string of the fourth embodiment.
Figure 34:
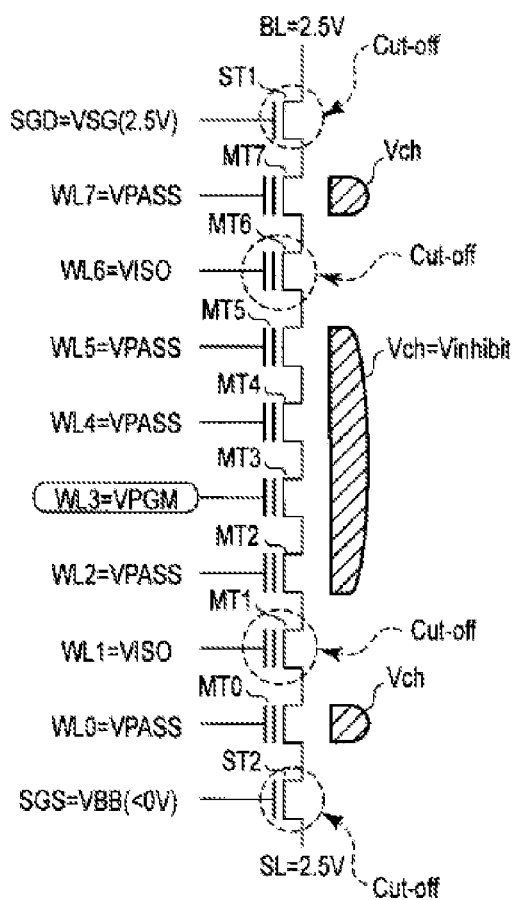
FIG. 34 is a circuit diagram illustrating the NAND string of the fourth embodiment.
Figure 35:
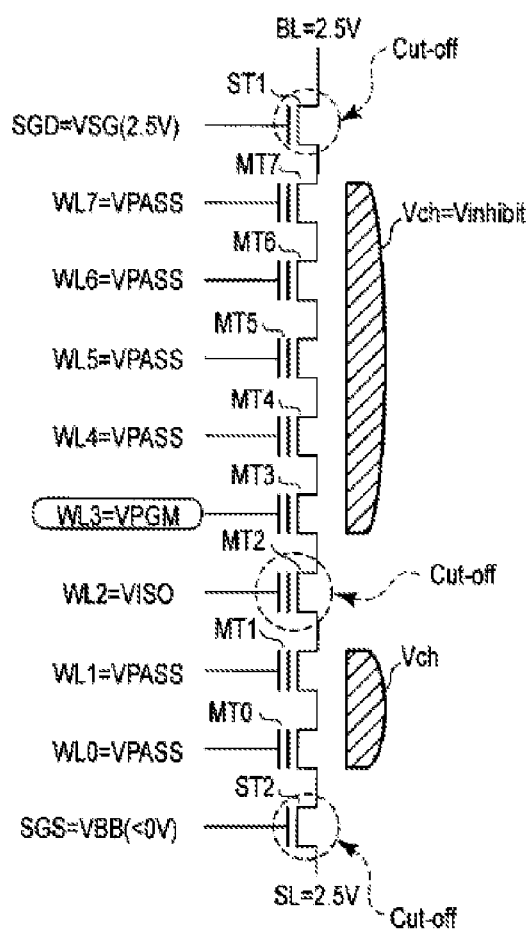
FIG. 35 is a circuit diagram illustrating the NAND string of the fourth embodiment.

A self boost system may be adopted in data writing. The data are written en bloc in page units. However, in this case, there exist columns that should be programmed and columns that should not. In this case, for the columns that should not be programmed, the select transistor ST1 is cut off, and the channel potential of the NAND string is increased due to coupling with the voltage VPASS, so that the program is inhibited. This method is known as the self boost method. In the following, a few examples of the self boost system that employs the self boost method will be explained with reference to FIGS. 33 to 35. FIGS. 33 to 35 are circuit diagrams illustrating the NAND strings 18. They show an example where the word line WL3 is selected. The dummy transistors and back gate transistors are not shown in the figures.

4.2.1 About First Example

Here, a first example will be explained with reference to FIG. 33. In this example, all of the memory cell transistors MT in the NAND strings 18 are used to boost the channel potential (the conventional self boost system).

As shown in the figure, the program voltage VPGM is applied to the selected word line WL3, and the VPASS is applied to all of the other non-selected word lines WL0 to WL2 and WL4 to WL7. As a result, channels are formed in the memory cell transistors MT0 to MT7. Then, by coupling with the potential of the word lines WL0 to WL7, the potential Vch of the channels increases to the write inhibiting voltage Vinhibit. Consequently, in the memory cell transistor MT3, the potential difference between the channel and the control gate becomes smaller, and program is not carried out.

4.2.2 About Second Example

Here, a second example is explained with reference to FIG. 34. In the second example, only a portion of the memory cell transistors MT in the NAND strings 18 are used to boost the channel potential (local area self-boost system).

As shown in the figure, this example differs from the first example shown in FIG. 33 in that the voltage VISO is applied to the word line WL1 and the word line WL6. By applying the voltage VISO, the memory cell transistors MT1 and MT6 are turned off. As a result, the channel of the memory cell transistor MT3 is cut off from the channels of the memory cell transistors MT0, MT7. This potential Vch is increased by coupling with the word lines WL2 to WL5.

4.2.3 About Third Example

Here, a third example is explained with reference to FIG. 35. In the third example, only the memory cell transistors MT in the erased state in the NAND strings 18 are used to boost the channel potential (erased area self-boost system).

In the third example shown in the figure, the voltage VISO is applied to the word line WL2. Selection of the word line WL3 refers to the fact that the data have been programmed with respect to the word lines WL0 to WL2. Consequently, in the third example, the memory cell transistor MT2 is cut off, and only the memory cell transistors MT4 to MT7 in the erased state are adopted to boost the channel potential.

4.2.4 About Relationship with Write Mode

The control part 17 in the NAND type flash memory 130 selects the self boost system corresponding to the write mode.

For example, when the WL increment mode is adopted, the control part 17 executes the program sequence according to the first or second example, and, when the string increment mode is adopted, the control part 17 executes the program sequence according to the third example. On the other hand, when the WL increment mode is adopted, the control part 17 executes the program sequence according to the first example, and, when the string increment mode is adopted, the control part 17 executes the program sequence according to the second or third example.

4.3 Effects of the Present Embodiment

According to the constitution related to the present embodiment, it is possible to further improve the operational reliability of the NAND type flash memory.

That is, as shown in FIGS. 13 and 14, in the WL increment mode, when a certain word line WL is selected, in another NAND string, the data may be already programmed in the memory cell transistors MT connected to the word lines nearer the SGD side than the selected word line. In the string increment mode, such a case does not take place. Consequently, one can see that the influence of the program disturbance can take place more easily in the WL increment mode than the string increment mode.

Therefore, in the WL increment mode, it is preferred that the write method with higher resistance to disturbance than the string increment mode be adopted. Here, according to the present embodiment, in the WL increment mode, the data are programmed with the SLC system, or the self boost system with a high resistance to the disturbance is adopted. As a result, it is possible to improve the operational reliability of the NAND type flash memory.

5. Embodiment 5

Here, the semiconductor storage device and the controller related to Embodiment 5 are explained. This embodiment relates to another example (third erasing method) different from the second erasing method explained above with reference to Embodiment 2.

5.1 About Constitution of NAND Strings

Figure 36:
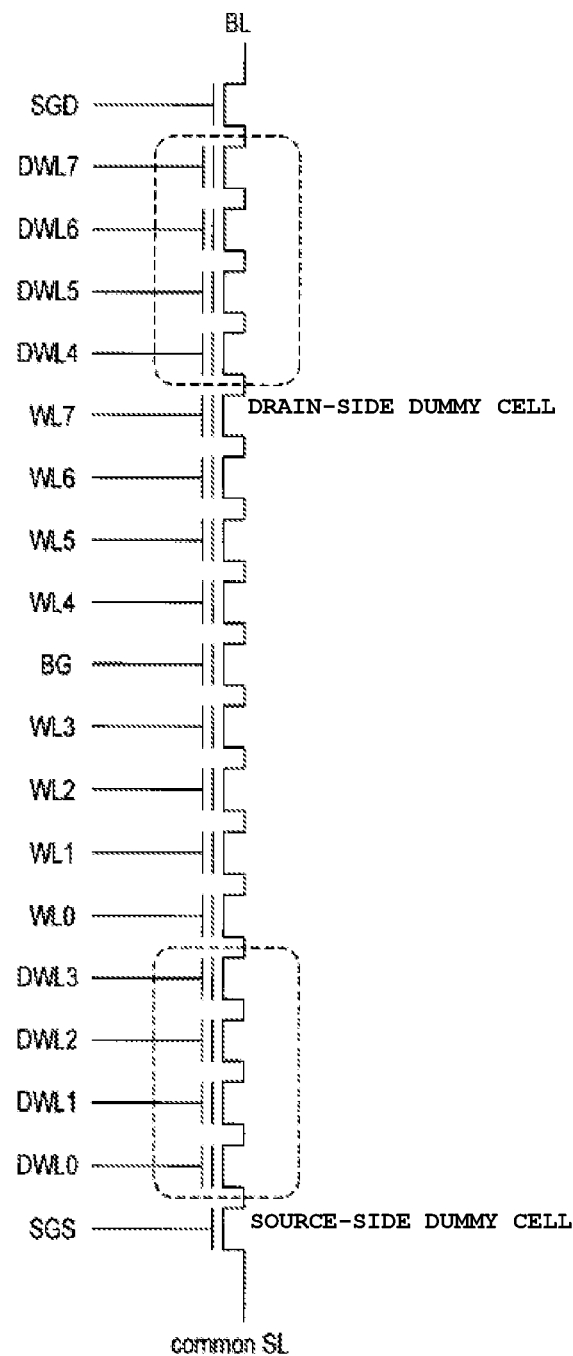
FIG. 36 is a circuit diagram illustrating a NAND string according to a fifth embodiment.

FIG. 36 is a circuit diagram illustrating the NAND strings 18 related to the present embodiment. As shown in the figure, for the NAND strings 18 related to this example, in the constitution explained with reference to Embodiment 1, the number of the dummy cells on the drain side and that of the dummy cells on the source side are both 4. Of course, this number is merely an example. It may also be 2 or 3, here is no specific restriction on this number. The dummy word lines DWL0 to DWL7 are connected to the control gates of these dummy cells, respectively.

Also, in this example, the source lines SL are connected commonly between the memory groups GP0 to GP4, and they are commonly connected between blocks.

5.2 About the Third Erasing Method

Figure 37:
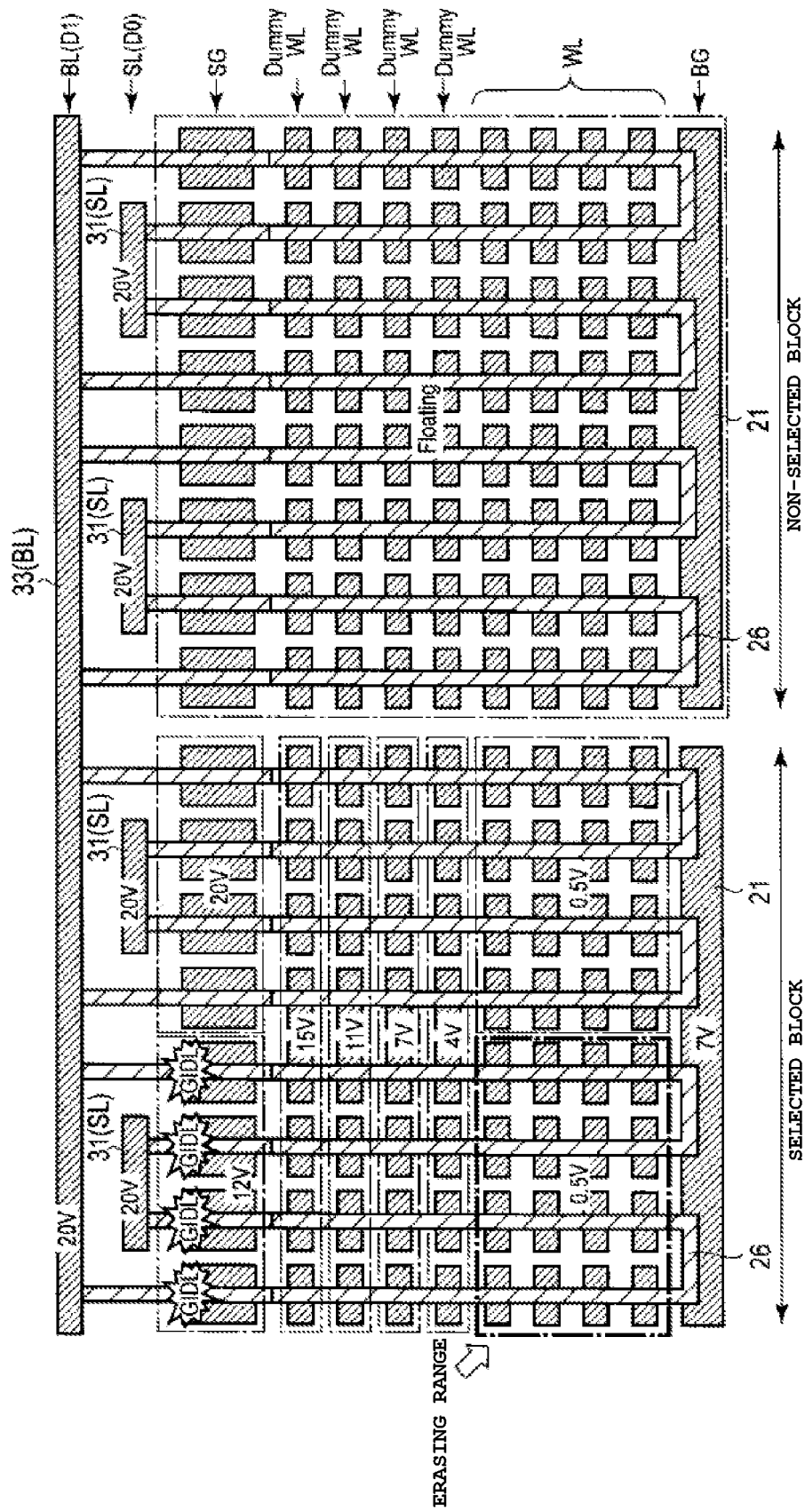
FIG. 37 is a cross-sectional view illustrating a memory cell array of the fifth embodiment.

Here, the third erasing method of the present example is explained. According to this method, just as in the second method, the data are erased in sub-block units, or, more specifically, in the unit of the memory group GP. FIG. 37 is a cross-sectional view illustrating two blocks, with plural NAND cells connected to one bit line BL. In FIG. 17, in particular, erasing is carried out in units of two memory groups GP.

As shown in the figure, the voltage Vera (=20 V) is applied to the bit line BL and the source lines SL. As explained above, as the source lines SL are common between the memory groups and the blocks, Vera is applied to all of the source lines SL.

First, the selected block will be explained. In the selected block, the CG driver 60 is used to send the voltage Vera_w1 (e.g., 0.5 V) to all of the word lines WL0 to WL7. Also, by the SGD driver 61 and SGS driver 62, the voltage VSGera (=12 V) is sent to the select gate lines SGD, SGS of the selected string, and the voltage VSGinhibit2 (=20 V) is sent to the select gate lines SGD, SGS of the non-selected string. In addition, by the CGDD driver 65 and CGDS driver 66, the voltages Vmid1 to Vmid4 are sent to the dummy word line DWL. In this case, the potential of the dummy word line DWL is set so that it sequentially decreases from near the select gate lines SGD, SGS to near the word line WL. In the example shown in FIG. 37, the Vmid1 (=15 V<VSGinhibit2) is applied to the dummy word lines DWL0, DWL7, Vmid2 (=11 V<Vmid1) is applied to the dummy word lines DWL1, DWL6, Vmid3 (=7 V<Vmid2) is applied to the dummy word lines DWL2, DWL5, and Vmid4 (=4 V<Vmid3, Vmid4>Vera_w1) is applied to the dummy word lines DWL3, DWL4.

In the non-selected blocks, just as in the first erasing method, all of the wirings are set electrically floating.

As explained above, the data in certain strings in the selected block are erased en bloc.

5.3 Effects of the Present Embodiment

According to the method related to the present embodiment, it is possible to carry out erasing in sub-block units. In this example, in order to prevent mis-erasing in the non-selected strings in the selected block, it is preferred that plural dummy word lines be arranged. Consequently, the layer number of the memory cell array increases. However, the source lines SL can be common for all of the blocks.

6. Modified Examples, Etc.

As explained above, the semiconductor storage device 1 related to the present embodiment has the memory cell transistors MT, the select transistors ST1, ST2, the NAND strings 18, the first and second blocks BLK, the word lines WL, and the select gate lines SGD, SGS. The memory cell transistors MT are laminated on a semiconductor substrate, and they each contain a charge storage layer and a control gate. In each of the NAND strings 18, the current paths of the plural memory cell transistors MT are connected in series, and, at the same time, in the memory cell transistors MT, the current paths of the select transistors ST1, ST2 are connected in series. The first and second blocks BLK each contain plural memory strings 18. The word lines WL are connected to the control gates of the memory cell transistors MT. The select gate lines SGD, SGS are connected to the gates of the select transistors ST1, ST2. When data are written in the first block (WL increment mode), while the first select gate line SGD is in the selected state, data are written sequentially in the memory cell transistors MT in the memory string 18 connected to the first select gate line SGD. When data are written in the second block (string increment mode), while the first word line WL is in the selected state, data are sequentially written in the memory cells in the plural memory strings 18.

Figure 38:
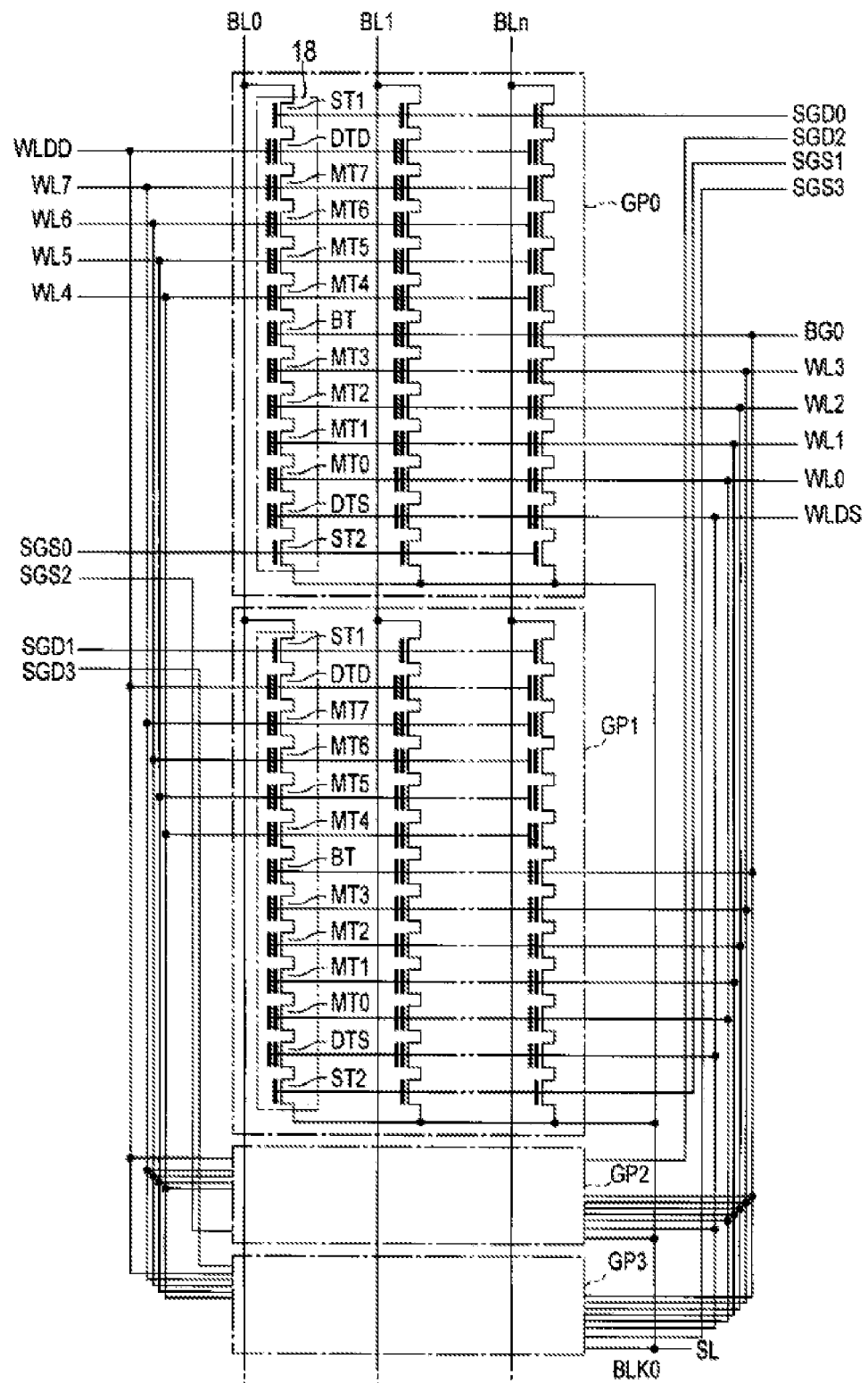
FIG. 38 is a circuit diagram illustrating a modified example of the memory cell array of the first through fifth embodiments.

The embodiment is not limited to the previously discussed embodiments. Various modifications can be made. For example, the memory cell array shown in FIG. 2 may also have the constitution shown in FIG. 38. FIG. 38 is a circuit diagram illustrating the block BLK0, and the same constitution is adopted for the other blocks BLK1 to BLK3. As shown in the figure, the word lines WL0 to WL3, the back gate line BG, the even number select gate lines SGD0, SGD2, and the odd number select gate lines SGS1, SGS3 are led out on one end side of the memory cell array 10. On the other hand, the word lines WL4 to WL7, the even number select gate lines SGS0, SGS2, and the even number select gate lines SGD1, SGD3 are led out on the other end side opposite to the one end side of the memory cell array. The constitution may also be adopted. According to this constitution, for example, the row decoder 11 is divided to two row decoders, and they are arranged facing each other with memory cell array 10 sandwiched between them. The following scheme may also be adopted: by one row decoder, the select gate lines SGD0, SGD2, SGS1, SGS3, the word lines WL0 to WL3, and the back gate line BG are selected, and, by the other row decoder, the select gate lines SGS0, SGS2, SGD1, SGD3, and word lines WL4 to WL7 are selected. According to this constitution, it is possible to alleviate the problem of complexity of wirings of the select gate lines and word lines, etc. in the region between the driver circuit 12 and the memory cell array 10 (containing the row decoder 11).

The previously discussed embodiments may also be combined appropriately for embodiment of the present invention. FIG. 39 is a diagram illustrating the table of the erasing method for the first and second regions, the SLC/MLC system, and the self boost system distinguished on the base of the write systems.

As shown in the figure, in the first region where data are written with the WL increment mode, the data are erased in the block unit or sub-block unit, the data are written in the SLC system, and the conventional self boost system or the local area self boost system may be adopted. In the second region where the string increment mode is adopted for data write, the data are erased in the block unit, the data are written with the MLC system, and the local area self boost system or the erased area self boost system may be adopted. In addition, although not described in the previously discussed embodiments, when data are read striding plural pages, the order of read may be the same as that of the write operation. That is, the data in the first region are read in the order explained with reference to FIGS. 9 and 10, and the data in the second region are read in the order explained with reference to FIGS. 11 and 12.

For the items other than those shown in FIG. 39, there may also be a difference between the first region and the second region. For example, the first and second regions may have different ECC systems adopted there. That is, in the second region, generation of the program disturbance can hardly take place. Consequently, the ECC system may also be adopted as it has easier arithmetic and logic operation, although its error correction ability is lower than that of the ECC system adopted in the first region.

In addition, in the first and second regions, there is no need to meet all of the relationships for the items shown in FIG. 39. Instead, it is sufficient when at least certain items are met. The items to be met may not necessarily contain the write system. For example, the first and second regions may also be distinguished according to the self boost system and/or the erasing system (in this case, the write systems of the first and second regions are the same). This case is also included in the embodiment.

Also, as an example of erasing in the sub-block unit, in the previously discussed embodiments, data erasure is carried out for two memory groups GP as a unit. However, erasure may also be carried out in each memory group as a unit, or in three or more memory groups as a unit.

The first region where the WL increment mode is adopted is preferably the region that accommodates the data with a small size. Consequently, for example, the following is preferable: in a FAT (File Allocation Table) file system, a boot sector, a FAT region, and a root directory entry region, etc. are taken as the first region, and the region that holds image data, moving picture data, and other nominal user data is the second region.

Additionally, the three-dimensional laminated NAND type flash memory is not limited to the constitution shown in FIGS. 3 to 5. For example, one may also adopt a scheme in which the semiconductor layer 26 is not in a U shape. Instead, it may be a single pillar shape. In this case, the back gate transistor BT is not needed. The voltages described in the previously discussed embodiments are also merely an example. They may be determined appropriately corresponding to the actual assembly. Regarding the treatments carried out in the flow chart, their order may be changed appropriately, and plural treatments may be carried out simultaneously.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a bit line;
   a source line;
   a first memory string including a first drain-side select transistor connected to the bit line, a first source-side select transistor connected to the source line, and first to sixth memory cells series-connected between the first drain-side select transistor and the first source-side select transistor, the first memory cell being closer to the first source-side select transistor than the first drain-side select transistor;
   a second memory string including a second drain-side select transistor connected to the bit line, a second source-side select transistor connected to the source line, and seventh to twelfth memory cells series-connected between the second drain-side select transistor and the second source-side select transistor, the seventh memory cell being closer to the second source-side select transistor than the second drain-side select transistor;
   a first select line connected to a gate of the first drain-side select transistor;
   a second select line connected to a gate of the second drain-side select transistor;
   a first word line connected to a gate of the first memory cell and a gate of the seventh memory cell;
   a second word line connected to a gate of the second memory cell and a gate of the eighth memory cell;
   a third word line connected to a gate of the third memory cell and a gate of the ninth memory cell;
   a fourth word line connected to a gate of the fourth memory cell and a gate of the tenth memory cell;
   a fifth word line connected to a gate of the fifth memory cell and a gate of the eleventh memory cell;
   a sixth word line connected to a gate of the sixth memory cell and a gate of the twelfth memory cell; and
   a control circuit configured to
     perform a first operation, the first operation including, at a first timing:
       supplying a first select voltage to the first select line, and at a second timing after the first timing:
supplying a second select voltage to the first select line,
supplying a first program voltage to the third word line,
supplying a first cut-off voltage to at least one of the second word line and the fifth word line, and
supplying a first pass voltage to the first word line, fourth word line and the sixth word line,
the second select voltage being lower than the first select voltage, the first cut-off voltage being lower than the first pass voltage, the first pass voltage being lower than the first program voltage and greater than the first select voltage, and
perform a second operation after the first operation, the second operation including,
at a third timing:
supplying the first select voltage to the second select line, and
at a fourth timing after the third timing:
supplying the second select voltage to the second select line,
supplying a second program voltage to the third word line,
supplying a second cut-off voltage to the at least one of the second word line and the fifth word line, and
supplying a second pass voltage to the first word line, fourth word line and the sixth word line,
the second cut-off voltage being lower than the second pass voltage, the second pass voltage being lower than the second program voltage and greater than the first select voltage.

2. The storage device according to claim 1, wherein
in the second timing of the first operation,
the first cut-off voltage is supplied to the second word line, and
the first pass voltage is supplied to the fifth word line, and
in the fourth timing of the second operation,
the second cut-off voltage is supplied to the second word line, and
the second pass voltage is supplied to the fifth word line.

3. The storage device according to claim 1, wherein
in the second timing of the first operation,
the first cut-off voltage is supplied to the second word line and the fifth word line, and
in the fourth timing of the second operation,
the second cut-off voltage is supplied to the second word line and the fifth word line.

4. The storage device according to claim 1, wherein the second operation is performed immediately after the first operation.

5. The storage device according to claim 1, wherein
in the first operation, first data is written in the third memory cell, and
in the second operation, second data is written in the ninth memory cell.

6. The storage device according to claim 1, wherein
the first and second program voltages are substantially the same,
the first and second cut-off voltages are substantially the same, and
the first and second pass voltages are substantially the same.

7. The storage device according to claim 1, further comprising:
a thirteenth memory cell between the second and third memory cells;
a fourteenth memory cell between the eighth and ninth memory cells; and
a seventh word line connected to a gate of the thirteenth memory cell and a gate of the fourteenth memory cell,
wherein the control circuit is configured to
perform a third operation after the second operation, the third operation including,
at a fifth timing:
supplying the first select voltage to the first select line, and
at a sixth timing after the fifth timing:
supplying the second select voltage to the first select line,
supplying a third program voltage to the fourth word line,
supplying a third cut-off voltage to at least one of the seventh word line and the sixth word line, and
supplying a third pass voltage to the first word line, second word line and the fifth word line,
the third cut-off voltage being lower than the third pass voltage, the third pass voltage being lower than the third program voltage and greater than the first select voltage, and
perform a fourth operation after the third operation, the fourth operation including,
at a seventh timing:
supplying the first select voltage to the second select line, and
at an eighth timing after the seventh timing:
supplying the second select voltage to the second select line,
supplying a fourth program voltage to the fourth word line,
supplying a fourth cut-off voltage to the at least one of the seventh word line and the sixth word line, and
supplying a fourth pass voltage to the first word line, second word line and the fifth word line,
the fourth cut-off voltage being lower than the fourth pass voltage, the fourth pass voltage being lower than the fourth program voltage and greater than the first select voltage.

8. The storage device according to claim 7, wherein
the fourth operation is performed immediately after the third operation,
in the third operation, third data is written in the fourth memory cell, and
in the fourth operation, fourth data is written in the tenth memory cell.

9. A method of performing a write operation in a storage device, said method comprising performing a first operation and a second operation after the first operation,
the storage device including
a bit line,
a source line,
a first memory string including a first drain-side select transistor connected to the bit line, a first source-side select transistor connected to the source line, and first to sixth memory cells series-connected between the first drain-side select transistor and the first source-side select transistor, the first memory cell being closer to the first source-side select transistor than the first drain-side select transistor, a second memory string including a second drain-side select transistor connected to the bit line, a second source-side select transistor connected to the source line, and seventh to twelfth memory cells series-connected between the second drain-side select transistor and the second source-side select transistor, the seventh memory cell being closer to the second source-side select transistor than the second drain-side select transistor, a first select line connected to a gate of the first drain-side select transistor, a second select line connected to a gate of the second drain-side select transistor, a first word line connected to a gate of the first memory cell and a gate of the seventh memory cell, a second word line connected to a gate of the second memory cell and a gate of the eighth memory cell, a third word line connected to a gate of the third memory cell and a gate of the ninth memory cell, a fourth word line connected to a gate of the fourth memory cell and a gate of the tenth memory cell, a fifth word line connected to a gate of the fifth memory cell and a gate of the eleventh memory cell, and a sixth word line connected to a gate of the sixth memory cell and a gate of the twelfth memory cell, the first operation including,
at a first timing:
supplying a first select voltage to the first select line, and
at a second timing after the first timing:
supplying a second select voltage to the first select line,
supplying a first program voltage to the third word line,
supplying a first cut-off voltage to at least one of the second word line and the fifth word line, and
supplying a first pass voltage to the first word line, fourth word line and the sixth word line,
the second select voltage being lower than the first select voltage, the first cut-off voltage being lower than the first pass voltage, the first pass voltage being lower than the first program voltage and greater than the first select voltage, and the second operation including,
at a third timing:
supplying the first select voltage to the second select line, and
at a fourth timing after the third timing:
supplying the second select voltage to the second select line,
supplying a second program voltage to the third word line,
supplying a second cut-off voltage to the at least one of the second word line and the fifth word line, and
supplying a second pass voltage to the first word line, fourth word line and the sixth word line,
the second cut-off voltage being lower than the second pass voltage, the second pass voltage being lower than the second program voltage and greater than the first select voltage.

10. The method according to claim 9, wherein
in the first operation,
the first cut-off voltage is supplied to the second word line, and the first pass voltage is supplied to the fifth word line, and
in the second operation,
the second cut-off voltage is supplied to the second word line, and
the second pass voltage is supplied to the fifth word line.

11. The method according to claim 9, wherein
in the first operation,
the first cut-off voltage is supplied to the second word line and the fifth word line, and
in the second operation,
the second cut-off voltage is supplied to the second word line and the fifth word line.

12. The method according to claim 9, wherein the second operation is performed immediately after the first operation.

13. The method according to claim 9, wherein
in the first operation, first data is written in the third memory cell, and
in the second operation, second data is written in the ninth memory cell.

14. The method according to claim 9, wherein
the first and second program voltages are substantially the same,
the first and second select voltages are substantially the same,
the first and second cut-off voltages are substantially the same, and
the first and second pass voltages are substantially the same.

15. A memory system comprising a storage device and a memory controller configured to issue commands to the storage device to perform read and write operations,
the storage device including
a bit line,
a source line,
a first memory string including a first drain-side select transistor connected to the bit line, a first source-side select transistor connected to the source line, and first to sixth memory cells series-connected between the first drain-side select transistor and the first source-side select transistor, the first memory cell being closer to the first source-side select transistor than the first drain-side select transistor, a second memory string including a second drain-side select transistor connected to the bit line, a second source-side select transistor connected to the source line, and seventh to twelfth memory cells series-connected between the second drain-side select transistor and the second source-side select transistor, the seventh memory cell being closer to the second source-side select transistor than the second drain-side select transistor, a first select line connected to a gate of the first drain-side select transistor, a second select line connected to a gate of the second drain-side select transistor, a first word line connected to a gate of the first memory cell and a gate of the seventh memory cell, a second word line connected to a gate of the second memory cell and a gate of the eighth memory cell, a third word line connected to a gate of the third memory cell and a gate of the ninth memory cell, a fourth word line connected to a gate of the fourth memory cell and a gate of the tenth memory cell, a fifth word line connected to a gate of the fifth memory cell and a gate of the eleventh memory cell, a sixth word line connected to a gate of the sixth memory cell and a gate of the twelfth memory cell, and a control circuit configured to perform first and second operations in response to a write command from the memory controller, the first operation including,
at a first timing:
supplying a first select voltage to the first select line, and
at a second timing after the first timing:
supplying a second select voltage to the first select line,
supplying a first program voltage to the third word line,
supplying a first cut-off voltage to at least one of the second word line and the fifth word line, and
supplying a first pass voltage to the first word line, fourth word line and the sixth word line,
the second select voltage being lower than the first select voltage, the first cut-off voltage being lower than the first pass voltage, the first pass voltage being lower than the first program voltage and greater than the first select voltage, and the second operation including,
at a third timing:
supplying the first select voltage to the second select line, and
at a fourth timing after the third timing:
supplying the second select voltage to the second select line,
supplying a second program voltage to the third word line,
supplying a second cut-off voltage to the at least one of the second word line and the fifth word line, and
supplying a second pass voltage to the first word line, fourth word line and the sixth word line,
the second cut-off voltage being lower than the second pass voltage, the second pass voltage being lower than the second program voltage and greater than the first select voltage.

16. The memory system according to claim 15, wherein
in the first operation,
the first cut-off voltage is supplied to the second word line, and
the first pass voltage is supplied to the fifth word line, and
in the second operation,
the second cut-off voltage is supplied to the second word line, and
the second pass voltage is supplied to the fifth word line.

17. The memory system according to claim 15, wherein
in the first operation,
the first cut-off voltage is supplied to the second word line and the fifth word line, and
in the second operation,
the second cut-off voltage is supplied to the second word line and the fifth word line.

18. The memory system according to claim 15, wherein the second operation is performed immediately after the first operation.

19. The memory system according to claim 15, wherein
in the first operation, first data is written in the third memory cell, and
in the second operation, second data is written in the ninth memory cell.

20. The memory system according to claim 15, wherein
the first and second program voltages are substantially the same,
the first and second select voltages are substantially the same,
the first and second cut-off voltages are substantially the same, and
the first and second pass voltages are substantially the same.

* * * * *